US010416295B2

(12) United States Patent
Warburton

(10) Patent No.: US 10,416,295 B2
(45) Date of Patent: Sep. 17, 2019

(54) INTERPOLATION MEASUREMENT OF THE ARRIVAL TIME AND/OR AMPLITUDE OF A DIGITIZED ELECTRONIC PULSE

(71) Applicant: XIA LLC, Hayward, CA (US)

(72) Inventor: William K. Warburton, Oakland, CA (US)

(73) Assignee: XIA LLC, Hayward, CA (US)

( * ) Notice: Subject to any disclaimer, the term of this patent is extended or adjusted under 35 U.S.C. 154(b) by 235 days.

(21) Appl. No.: 15/332,941

(22) Filed: Oct. 24, 2016

(65) Prior Publication Data
US 2018/0113203 A1    Apr. 26, 2018

(51) Int. Cl.
G01T 1/17      (2006.01)
G01R 29/02     (2006.01)
G04F 10/00     (2006.01)
G01S 7/486     (2006.01)

(52) U.S. Cl.
CPC ............ *G01S 7/4865* (2013.01); *G01R 29/02* (2013.01); *G01T 1/17* (2013.01); *G04F 10/00* (2013.01)

(58) Field of Classification Search
CPC .................................................. G01T 1/2958
See application file for complete search history.

(56) References Cited

U.S. PATENT DOCUMENTS 3,763,436 A    10/1973  Haw
5,266,953 A    11/1993  Kelly et al.
5,382,848 A     1/1995  Burns et al.
5,446,271 A *   8/1995  Cherry ............... G06K 7/10861
                                                235/462.1
5,684,850 A    11/1997  Warburton et al.
5,873,054 A     2/1999  Warburton et al.
5,960,097 A *   9/1999  Pfeiffer ................ G06K 9/3241
                                                342/357.59

(Continued)

FOREIGN PATENT DOCUMENTS

WO       2016/082006 A1    6/2016

OTHER PUBLICATIONS

PCT/US2017/058143, "International Search Report and Written Opinion", dated Dec. 27, 2017, 12 pages.

(Continued)

*Primary Examiner* — David P Porta
*Assistant Examiner* — Djura Malevic
(74) *Attorney, Agent, or Firm* — Kilpatrick Townsend & Stockton LLP

(57) ABSTRACT

A digital processing technique for measuring the time of arrival of a digitized electronic signal pulse for in-line implementation in a field programmable gate array or digital signal processor. For each detected pulse, an interpolation method is used to estimate its maximum M, M is multiplied by a fraction f, and a second interpolation method is used to estimate the time when the pulse reaches the value f·M, which is then taken as the pulse's time of arrival. Various interpolation methods may be used. A particularly accurate method employs convolution of the pulse data by a kernel that is the product of the sinc function and a Gaussian. Detector physics limited time resolutions of 2-5% of the sampling interval are demonstrated. Estimating M is useful in its own right for determining pulse amplitudes, for example as a measure of the energies of photons absorbed in a detector.

24 Claims, 12 Drawing Sheets

(56) References Cited

U.S. PATENT DOCUMENTS

| | | | |
|---|---|---|---|
| 7,411,199 B2 | 8/2008 | Vernon | |
| 8,003,948 B2 | 8/2011 | Haselman et al. | |
| 8,812,268 B2* | 8/2014 | Scoullar | G01V 1/28 702/182 |
| 9,223,031 B2* | 12/2015 | Burr | G01T 1/1647 |
| 2007/0036241 A1* | 2/2007 | Sahinoglu | G01S 5/0221 375/317 |
| 2008/0169347 A1* | 7/2008 | Olmstead | G06K 7/14 235/462.41 |
| 2010/0034353 A1* | 2/2010 | Kravis | G01V 5/0016 378/87 |
| 2010/0139989 A1* | 6/2010 | Atwater | G01G 19/4144 177/245 |
| 2011/0251828 A1* | 10/2011 | Scoullar | G01V 1/28 702/189 |
| 2012/0063547 A1* | 3/2012 | Pietrzyk | G01S 11/02 375/316 |
| 2013/0143595 A1* | 6/2013 | Moshfeghi | H04W 4/029 455/456.1 |
| 2013/0168534 A1* | 7/2013 | Burr | G01T 1/1647 250/208.2 |
| 2014/0204700 A1* | 7/2014 | Valero | G01S 15/006 367/7 |
| 2017/0023496 A1* | 1/2017 | Persson | A61B 6/482 |

OTHER PUBLICATIONS

U.S. Appl. No. 15/832,941, filed Oct. 24, 2016.

Bardelli et al., "Time measurements by means of digital sampling techniques: a study case of 100 ps FWHM time resolution with a 100 MSample/s, 12 bit digitizer", NIM_A 521,480-492 (2004).

Buzhan et al, "Silicon photomultiplier and its possible applications", NIM_A 504,48-52 (2003).

Du et al., "Study of time resolution by digital methods with a DRS4 module", arXiv:1506.07219 Jun. 24, 2015.

Fallu-Labruyere et al., "Time resolution studies using digital constant fraction discrimination", NIM_A, 579, 247-251 (2007).

Haselman et al., "Simulation of algorithms for pulse timing in FPGAs", *2007 IEEE Nucl. Sci. Symp. Conf. Record* 4:3161-3165 (1997).

Knoll, Chapter 17_IX_A "Time Pickoff Methods" in *Radiation Detection and Measurement* (Wiley, New York, 2000), pp. 659-665.

Moszynski et al., "New Photonis XP20D0 photomultiplier for fast timing in nuclear medicine" Needs a Reference.

Mutti et al., "FPGA implementation of a digital constant fraction discriminator for fast timing in the picosecond range", Poster TUPPC083, Proc. ICALEPCS2013 (San Francisco, CA 2013), available at accelconf.web.cern.ch/AccelConf/ICALEPCS2013/papers/tuppc083.pdf.

Paulauskas et al., "A digital data acquisition framework for the Versatile Array of Neutron Detectors at Low Energy (VANDLE)", NIM_A, 737, 22-28 (2014).

Ronzhin et al., "Tests of timing properties of silicon photomultipliers", FERMILAB-PUB-10-052-PPD or SLAC-PUB-14599.

Teige et al., "Photomultiplier pulse timing using flash analog-to-digital converters", GlueX Note—zzz, Jan. 24, 2005, available at https://userweb.jlab.org/~brads/Manuals/Hardware/ JLab/FADC/timing_extraction/Tiege-FADC_timing_algorithm-Jan2005.pdf.

Wang et al., "Waveform timing performance of a 5 GS/s fast pulse sampling module with DRS4", available at arXiv.org at https://arxiv.org/pdf/1501.00651.

Wolberg, Chapter 39 "Sampling, Reconstruction and Antialiasing", in Computer *Science Handbook*, $2^{nd}$ Ed., A.B. Tucker, Ed. in Chief, (CRC Press, New York, 2004).

* cited by examiner

INTERPOLATION MEASUREMENT OF THE ARRIVAL TIME AND/OR AMPLITUDE OF A DIGITIZED ELECTRONIC PULSE

Table of Contents

| | | |
|---|---|---|
| Cross Reference to Related Applications | | |
| Background of the Invention | | 2 |
| 1. | | 3 |
| | 1.1. Current analog art for detecting pulse arrival times | 3 |
| | 1.2. Digital detection of pulse arrival times | 4 |
| | 1.3. Current digital art for detecting pulse arrival times | 5 |
| | 1.4. The need for improved digital timing algorithms | 8 |
| | 1.5. Pulse amplitude measurements | 9 |
| Summary of the Invention | | 10 |
| Brief Description of the Drawings | | 10 |
| Description of Specific Embodiments | | 12 |
| 2. | | 12 |
| | 2.1. Hardware Considerations | 12 |
| | 2.2. Investigation of errors in digital constant fraction discrimination | 12 |
| | 2.3. An accurate digital constant fraction discrimination method | 14 |
| |     2.3.1. General approach | 15 |
| |     2.3.2. Implementation using fitting methods | 15 |
| |     2.3.3. Implementation using convolution methods | 16 |
| |     2.3.4. Preferred convolution method | 17 |
| |     2.3.5. Finding the maximum M | 18 |
| |     2.3.6. Finding $\phi$ and $t_A$ | 19 |
| | 2.4. Results 1: laser-illuminated PMTs - fast pulses | 20 |
| | 2.5. Results 2: $^{60}$Co irradiated LaBr$_3$ crystals - semi-fast pulses | 21 |
| | 2.6. Implementation | 23 |
| | 2.7. An accurate digital amplitude measurement method | 24 |
| | 2.8. Results 3: laser-illuminated PMTs - fast trigger pulses | 24 |
| | 2.9. Results 4: $^{60}$Co irradiated LaBr$_3$ crystals - semi-fast pulses | 25 |
| | 2.10. Discussion | 25 |
| 3. References | | 25 |
| 4. Conclusions | | 27 |
| What is Claimed is: | | 29 |
| Abstract of the Disclosure | | 33 |

CROSS REFERENCE TO RELATED APPLICATIONS

This application is related to U.S. patent application Ser. No. 15/332,836, filed October 24, for "Ratio-Reference Measurement of the Arrival Time and/or Amplitude of a Digitized Electronic Pulse" (inventors William K. Warburton and Wolfgang G. Hennig), the entire disclosure of which is hereby incorporated by reference for all purposes.

BACKGROUND OF THE INVENTION

The present invention relates generally to the detection of the time of arrival of signal pulses and measuring their amplitudes. This problem arises in many fields and contexts. For timing, a small set of examples include: medicine, where coincidence between photons is the core component of PET scanning; nuclear physics, where time of arrival is used to determine neutron energies; and LIDAR, where range to target is found from total photon travel time. This list is far from complete and is presented merely to suggest the breadth of applications. We note that, commonly, timing measurements fall into two classes.

In the first class, the time of arrival is compared to some "start" signal and the measured interval carries the information of interest (e.g., LIDAR, where "start" is the emission of the laser pulse and the time interval represents the distance to the target). An important subclass is time-of-flight (TOF), where the interval measures the time for a particle to traverse a known distance. This is the way neutron energies are measured, with the start coming from a nuclear decay and the stop from a proton ejected in a scintillator by the neutron. Dividing the trajectory distance by the TOF gives the neutron's velocity and hence its energy. The amplitude of the proton-generated pulse carries no information about the neutron's energy and is not of interest.

In the second class, time differences between multiple events are measured and compared and only those pairs that occur within a preset time difference (the "coincidence window") represent valid events for analysis (e.g., PET, where pairs of gamma-rays emitted from the same positron decay are found thusly). For amplitude measurement, a common example is the determination of energies of x-rays and gamma-rays absorbed in a variety of detectors, where accuracies of 0.1 to 1-2 percent may be required, depending upon the application. Here the time of arrival is not of interest. We therefore see that, depending upon the application, the time-of-arrival, the amplitude, or both may be of interest. Further, while this invention was developed in the context of the detection of photons in photomultiplier tubes, its range of application will be much broader.

1.

1.1. Current Analog Art for Detecting Pulse Arrival Times

FIG. 1 represents a typical pulse 10 whose arrival time we might want to detect. For the purposes of illustration it has a full width at half maximum of about 20 ns and is shown as it would appear if digitized at 2 GSA (gigasamples/second), which closely tracks the underlying analog signal. As is common, its risetime is faster than its fall time, the former typically set by the bandwidth of the circuit and the latter by some physical process such as the decay time of a scintillator.

KNOLL [KNOLL—2000] lists various techniques used in nuclear physics for the detection of pulses and a review of related fields shows that these are typical of other areas as well, the problem not being specific to any particular application. These methods, all initially developed for use in analog electronics, include: 1: leading edge triggering; 2: crossover timing; constant fraction discrimination; 4: amplitude and risetime compensated timing; and 5: extrapolated leading edge timing. We briefly elaborate these in the following.

Leading edge timing is very simple. The input signal is compared to a fixed threshold by a fast comparator, which produces an output signal when an incoming pulse crossed the threshold. This method works best for pulses of a similar shape and amplitude since larger pulses will cross the threshold earlier than smaller pulses.

Crossover timing. In this method, the input signal is differentiated and the peak of the original pulse is detected as time of arrival by the zero crossing of the differentiated signal. For this to work the pulse shape must not vary. Further, as it is generally understood that time resolution improves with the slope of the signal (large derivative) this method is limited by looking for a zero value in the derivative.

Constant fraction timing. In analog implementations, this is carried out by adding together the original signal attenuated by a factor f and the original signal delayed and inverted, as shown by the trace a-CFD 12 in FIG. 1. The zero crossing is taken as the time of arrival $t_A$. 14 This works best for signals whose time at or close to maximum is large compared to their rise times and also have a constant pulse shape.

Amplitude and risetime compensated timing is a variant of constant fraction timing intended for use with pulses whose shapes are not constant, as typically found in large germanium detectors where an absorbed gamma-ray may deposit charge at multiple locations. The method sets f small so that the crossover point occurs close to the arrival of the pulse, before it has much chance to change shape.

Extrapolated leading edge timing uses two leading edge discriminators set at different voltages ($v_1$ and $v_2$), captures their crossing times ($t_1$ and $t_2$) and uses the resultant pair of points ($v_1$, $t_1$) and ($v_2$, $t_2$) to extrapolate back to an inferred arrival time (0, $t_0$). This method assumes that pulse shapes are initially constant. A weakness is that the detected points are found at low signal slopes, which inherently reduces timing accuracy, and that a difference is required, which also adds further errors.

1.2. Digital Detection of Pulse Arrival Times

The arrival of digital signal processing brought both opportunities and challenges to the problem of detecting pulse arrival times. On the one hand, many techniques that are difficult in analog electronics, in particular linear time delays, are trivial digitally using shift registers. On the other hand, digital samples of the signal are only available at intervals, with the intervening signal being lost.

In any case, the first response to the advent of digital sampling and processing was to simply implement the well understood analog timing methods digitally. Thus Haw [HAW—1973] presents what is essentially constant fraction discrimination. Kelly [KELLY—1993] describes extrapolated leading edge timing. Burns and Tso [BURNS—1995] describe a hybrid method that is essentially analog constant fraction discrimination but with the pulse delay being carried out digitally. Vernon [VERNON—2008] digitally implements extrapolated leading edge timing by fitting a straight line to a series of points on the pulse's leading edge and extrapolating back to the baseline to find the arrival time.

In most cases, the resultant time resolutions were degraded, compared to what could be achieved using analog methods. To understand this, we look at FIG. 2, which compares the method implemented with samples taken at 2 GSA 12 to the same method using samples taken at 100 MS/s (megasamples/sec) 16. In both cases the same CFD function is implemented:

$$CFD[i]=fy[i]-y[i-D], \quad (1)$$

where f is the weighting fraction and D is the number of points required to implement the desired delay. Clearly, since the 2 GSA trace 12 has 20 times as many points (0.5 ns/point) as the 100 MS/s trace 22 (10 ns/point), D will be 20 times larger in the former case to implement the same delay. The zero crossing is then estimated by extrapolating between the two data points bracketing zero. This linear extrapolation line 24 is shown for the 100 MS/s case.

An enlarged view of the extrapolation view is shown in FIG. 3, including the bracketing points A 36 and B 38. The 100 MS/s zero crossing, found from the intersection between the linear extrapolation 24 and zero is $t_D$ 30. The linear extrapolating line for the 2 GSA zero crossing, $t_A$ 32 is not shown. The two estimates differ by about 0.5 ns and clearly arise from the local curvature of the CFD signal, which the 2GSA signal tracks closely. The magnitude of the error clearly increases as the bracketing points lier further from the zero crossing point.

While the arrival time error can be minimized by digitizing pulses at extremely high rates, there are associated costs which include not just the higher cost of high speed analog to digital converters (ADCs) but also the associated power consumption and parts costs of providing the downstream digital processing electronics that can operate at the same rate. Where more accurate timing is required from slower ADCs, methods have been developed to interpolate the d-CFD function 22 between the bracketing points A 36 and B 38 using a variety of methods that include fitting a polynomial or spline to the pulse locally or fitting some more general curve to the entire pulse. We will review some of these methods in the next section. Their general result is to produce values of the pulse at much closer intervals 40, which can then be interpolated, just as if the pulse had been locally sampled by a much faster digitizer.

1.3. Current Digital Art for Detecting Pulse Arrival Times

In this section we will review the current literature that provides the present level of performance for digitally implemented timing systems as these results will create the standard by which to judge the performance of the present invention. Generally speaking, we will look at two classes of timing experiment: 1) those using very fast pulses, for example from a fast semiconductor detector, such as a silicon PMT (SiPM) or avalanche detector, for from a PMT with a picosecond laser pulse input. These pulses typically have a risetime as short as 1-2 ns and a fall time of 2-5 ns. 2) Those using pulses from fast inorganic scintillators coupled to PMTs. A typical example is $LaBr_3$, which a risetime of 3-4 ns and a fall time of 25-30 ns.

Bardelli et al. [BARDELLI—2004] studied the factors affecting time resolution for digitized charge integrating preamplifier pulses (step pulses with a fast leading edge) including sampling rate and number of digitizer bits. Observing errors due to simple linear interpolation between the digital samples, as described in reference to FIG. 3 above, they investigate various polynomial interpolation methods and develop curves of expected error as a function of preamplifier rise time for different sampling rates and effective number of digitizer bits. Working with a Si detector, they claim to have achieved 125 ps time resolution, but the meaning of this result is unclear, since it is between two different implementations of digital timing for the same pulse, taken on a pulse by pulse basis, which means that the errors in the two measurements may not be independent.

Ronzhin et al. [RONZHIN—2010] used analog electronics with silicon photomultipliers (SiPMs) pulsed with a picosecond laser to investigate time resolution as a function of SiPM size and overvoltage. Their best results were of order 100 ps using 405 ns laser light, which sets a standard for these devices. These times are similar (123 ps) reported by Buzhan et al. [BUZHAN—2003], who did not provide a detailed description of their experimental setup. On the digital side, Tiege et al. [TIEGE—2005] sampled pulses at 2.5 GSA from FEU-84-3 PMTs illuminated with a LN300C nitrogen laser, applied a Gaussian to linear transformation followed by a linear interpolation at 50% of peak to obtain 150-180 ps time resolution. About 10 years later, Wang et al. [WANG—2016] looked at cosmic ray pulses in EJ200 fast plastic scintillators using 900 ps risetime GDB60 PMTs digitized with a well calibrated DRS4 digitizer at 5 GSA and obtained 113-132 ps time resolution FWHM.

Looking at organic scintillators, in 2005 Moszynski et al. [MOSZYNSKI—2005] used analog electronics with a XP20D0 PMT to measure achievable time resolutions with several organic scintillators. In particular, using $LaBr_3$, they achieved 200 ps for 511 keV gamma-rays and 140 ps with 1.33 MeV gamma-rays, the larger pulses reducing errors due to both noise and digitization errors from ADC non-linearity and effective number of bits. On the digital side, Fallu-Labruyere et al. [FALLU-LABRUYERE—2007] implemented a zero crossing CFD digitally using a 75 MS/s 12 bit ADC and obtained 576 ps FWHM from LaBr3. This was better than the results obtained by Haselman et al. [HASELMAN—1997, 2011], who estimated pulse heights from pulse areas and then created a lookup table for pulse arrival time based on the pulse height and the amplitude of the first sample on the curve above some threshold, but were only able to achieve 2.4 ns FWHM using a 70 MS/s ADC and LSO, which also has a fast risetime. Some years later, in 2013, Mutti et al. [MUTTI—2013] did somewhat better looking for zero crossings in the pulses' second derivatives (i.e., crossover timing), achieving 500 ps FWHM from full energy 511 keV gamma-rays in $LaBr_3$. Finally, in 2015, Du et al. [DU—2015] matched the Moszynski results, also using XP20D0 PMTs with $LaBr_3$ at 511 keV, achieving 195 ps FWHM by linear interpolation between samples in a constant fraction algorithm.

In 2014, Paulauskas et al. [PAULAUSKAS—2014] published a careful study of the effects of digitizing speed and pulse amplitude for three digital timing methods. These were: 1) d-CFD implemented on the digitized pulses, using a spline to make the zero crossing interpolation; 2) CFD implemented on a functional fit to the pulses of the form:

$$f(t) = \alpha e^{(t-\phi)/\beta}(1 - e^{-(t-\phi)^4/\gamma}), \quad (2)$$

and, 3) a method they called a Weighted Average Algorithm, which actually estimates the pulse's first moment according to:

$$\phi = \Sigma_{i=\alpha}{}^{\beta}(y_i - \overline{b})i / \Sigma_{i=\alpha}{}^{\beta}(y_i - \overline{b}). \quad (3)$$

Their general findings were that the fitting method gave the best timing resolution, followed by the Weighted Average Algorithm. In many cases the d-CFD gave split timing peaks. Only the functional fitting method gave accurate enough results for their neutron time-of-flight experiment, even though it required that the pulses be analyzed off-line. The best timing between plastic scintillators they achieved was 625 ps, which was at least partially due to their use of PMTs not principally intended for timing studies. This number is to be compared to the 51 ps inherent accuracy of the method when processing pulses from an arbitrary function generator.

To review these results: with fast pulses, as from laser-illuminated SiPMs or timing PMTs, the limits of analog CFD techniques hover about the 100 ps mark. Similar values have been obtained using digital CFD with 4-5 GSA sampling rates. However, at lower sampling rates of 250 MS/s or below, the time resolution degrades markedly, typically to 500 ps or worse.

Similarly, when looking a fast inorganic scintillators, such as $LaBr_3$, analog CFD timing can achieve time resolutions of 140-200 ps, depending upon pulse amplitude, for large energy pulses. These results have been duplicated with 5 GSA digital systems. However, with digitization rates of 100 MS/s or below, achievable resolutions fall to 500 ps or below.

1.4. The Need for Improved Digital Timing Algorithms

FIG. 4 shows a block diagram schematic of a typical digital spectrometer 40. An external sensor 42 is connected (possibly through a preamplifier—not shown) to an ADC 44, which digitizes it signal. The digitized signal is passed to a digital computing device 45 that may contain a field programmable gate array (FPGA) 46, a digital signal processor (DSP) 48, both, or some other equivalent device. The digital computing device typically includes or can access a local memory 50 that can store data for processing or buffer results prior to external transfer. It also typically connects 52 to some external computer system, network or display device to deliver or display its results. Due to cost, power or space constraints, the resources of the digital computing device 45 and memory 50 are still small compared to those of a modern desktop computer.

Because typical FPGA and DSP clock speeds are of order 200-250 MHz, data from faster ADCs cannot be processed directly, but has to be captured in blocks that are somehow then processed in parallel. For example, data from a 500 MS/s ADC is captured in 2 sample blocks at 250 MHz and then reassembled into traces which may then be processed when a pulse is detected. This is a complex process requiring abundant, and therefore expensive, gate array logic, a problem which only worsen as the ADC clock rate rises. Alternatively, the data can be captured and stored and analyzed later, off line. This approach not only adds the cost of the storage and post-processing equipment, but the results are not available for real-time decisions.

On the other hand, while modern processing logic can deal with 250 MS/s digitizers in a fairly straightforward manner, results to date show that achieving the best time resolution (which is still not good compared to either analog timing or very high speed digital timing) requires the use of fitting algorithms which are not readily implemented within the resource constraints of typical digital spectrometers. The resulting need to offload captured pulses for time-of-arrival analysis then limits the pulse rates at which the spectrometers can run. This problem currently precludes the use of digital processing in applications like positron emission tomography, which employs a large number of detector channels, all of which need to run at millions of counts/second.

It would thus be beneficial to provide a digital timing algorithm with the following characteristics: provides time resolution approaching or matching the best analog time resolutions; does so using data captured by ADC operating at the lower speeds readily amenable to direct processing with current FPGAs and DSPs; and, is simple enough to be implemented within the resource constraints of those FPGAs and DSPs.

1.5. Pulse Amplitude Measurements a) Analog Methods:

Pulse peak detection methods are well known in the art of electrical engineering as well as in nuclear instrumentation and are typically some variant of a diode connected to a capacitor so that a charging current flows into the capacitor until the peak voltage is reached and then ceases, thereby recording the maximum. This maximum can be either used in later operations or digitized and stored.

b) Digital Methods:

Several digital methods are in use for determining pulse amplitudes, particularly in applications where the amplitude represents some physical quantity, such as the energy deposited in a detector. These are: 1) digitizing the pulse and applying a comparator to extract the maximum value produced; 2) summing the digital values over the pulse region (i.e., integrating the pulse) as a representation of its amplitude; and, 3) fitting an analytic expression to the pulse, as described above in the section of finding times of arrival, and using the peak of the fit as the amplitude.

c) Issues with Existing Methods:

The major issues with these methods have already been discussed above in the sections discussing issues in finding a maximum value for use in constant fraction discrimination, and may be summarized as: 1) requiring a high rate of digitization if the pulse peak is not to be missed; 2) issues in knowing where the pulse starts and stops, particularly with pulses from scintillators that, in principal, can extend to arbitrarily long times; 3) fitting functions are sensitive to multiple pulse features and so can produce distortions in their estimates of the maximum value.

It would thus be beneficial to provide a digital algorithm for finding pulse maxima with the following characteristics: provides amplitude resolution approaching or matching the best resolutions provided by analog methods; does so using data captured by ADC operating at the lower speeds readily amenable to direct processing with current FPGAs and DSPs; and, is simple enough to be implemented within the resource constraints of those FPGAs and DSPs.

SUMMARY OF THE INVENTION

Embodiments of the present invention provide a digital processing technique for estimating the value of a characteristic of a digitized electronic signal pulse that includes the time of arrival and/or the maximum value of the digitized electronic signal pulse. The technique achieves time resolution approximating that of the best analog techniques while using data from lower speed ADCs and while being capable of in-line implementation in a field programmable gate array or digital signal processor. In particular, a method of measuring the maximum value of the pulse includes detecting a pulse in the digital data stream, and using an interpolation method to obtain an accurate estimate M of its maximum.

If it is desired to determine the arrival time, further method steps include multiplying M by a fraction f, and then using a second interpolation method to estimate the time when the pulse reaches the value f·M, which is then taken as the pulse's time of arrival. Various interpolation methods may be used. A particularly accurate method employs convolution of the pulse data by a kernel that is the product of the sinc function and a Gaussian.

A further understanding of the nature and advantages of the present invention may be realized by reference to the remaining portions of the specification and the drawings, which are intended to be exemplary and not limiting.

DESCRIPTION OF SPECIFIC EMBODIMENTS

2.

2.1. Hardware Considerations

Figure 4:
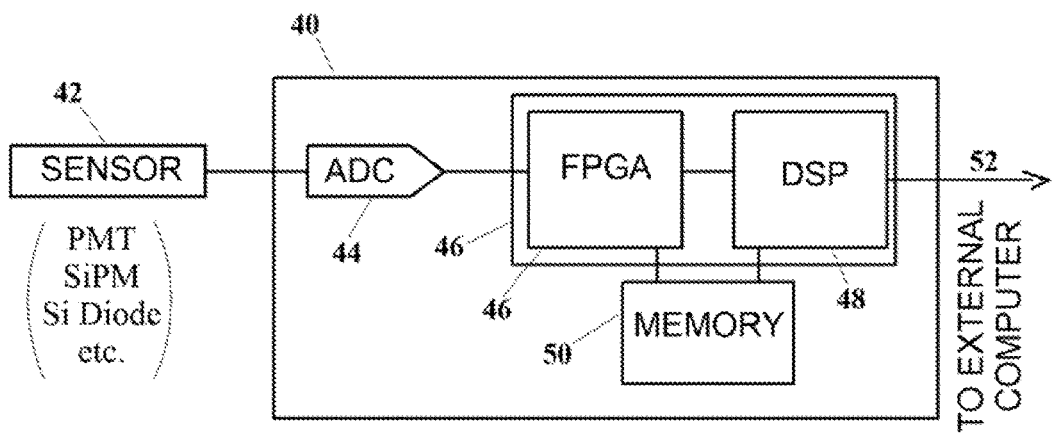
FIG. 4 (Prior Art) shows a block diagram of a typical digital spectrometer.

As discussed above, FIG. 4 shows a typical digital spectrometer 40. The figure is labeled "Prior Art" because the illustrated spectrometer, in its physical form at the level drawn, and when programmed or otherwise configured as described in the Background of the Invention, is conventional. However, the illustrated spectrometer, when programmed or otherwise configured to carry out methods according to embodiments of the present invention, should not be considered prior art. Also, as discussed above, and below in connection with specific embodiments, the spectrometer's digital computing device 45 may contain the field programmable gate array (FPGA) 46, the digital signal processor (DSP) 48, both, or some other equivalent device. Thus, for example, embodiments of the invention can be implemented with or without the illustrated DSP.

2.2. Investigation of Errors in Digital Constant Fraction Discrimination

Figure 3:
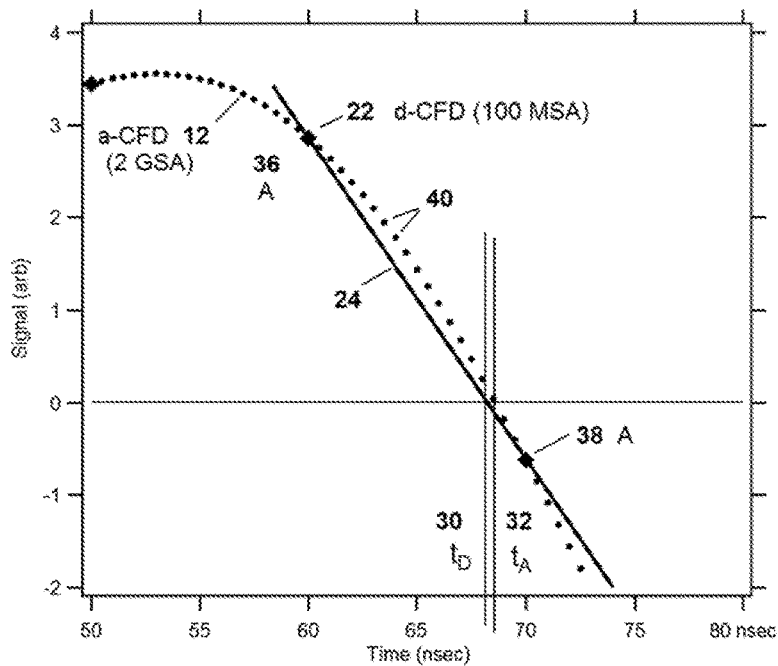
FIG. 3 (Prior Art) shows an expanded view of the zero crossing region of FIG. 2.

As discussed above, the digital CFD function has been typically implemented as:

$$CFD[i]=fy[i]-y[i-D], \quad (4)$$

where f is the weighting fraction and D is the number of points required to implement the desired delay. That is, CFD[i] contains two copies of the sampled function y[i], with one offset and scaled with respect to the other. As noted in our discussion of FIG. 3, this function is too coarse to get good time resolution from its zero crossing. As further noted, attempts have been made to alleviate this problem by interpolating CFD[i] through the zero crossing with relatively poor results. We have not found any analysis in the literature that explains this failure.

In our research we have identified the sources of error and thereby found a way to minimize them. We begin by recasting the problem, noting that the concept of constant fraction discrimination is to locate the point on a pulse where it reaches a constant fraction f of its maximum. Since analog circuitry does not have the luxury offered by digital analysis of capturing or delaying a trace for later analysis, the method represented by EQN. 4 was developed to locate this point. It was then translated into digital processing without a careful analysis of the effects of discrete time sampling.

Figure 1:
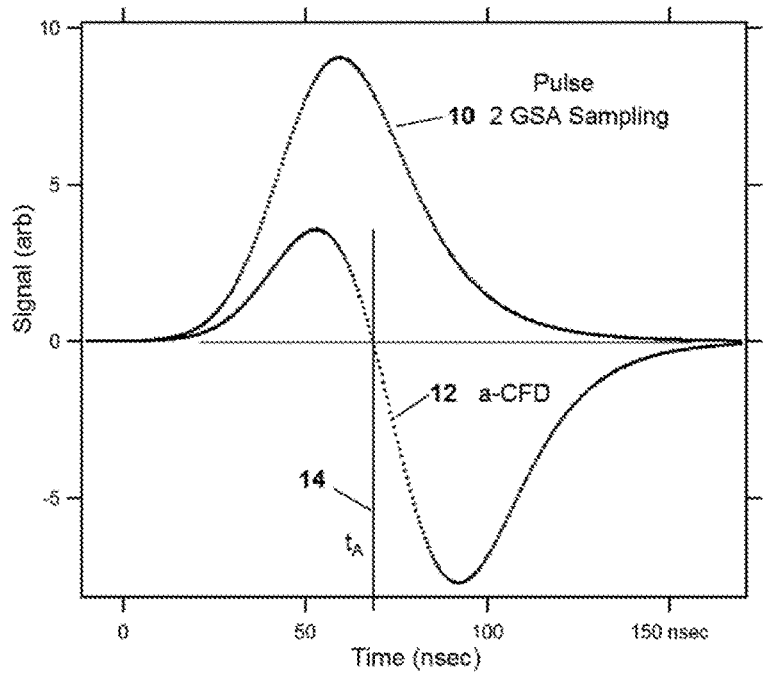
FIG. 1 (Prior Art) shows both an electrical pulse and its transformation into a signal for determining its time of arrival by the constant fraction discrimination method.
Figure 2:
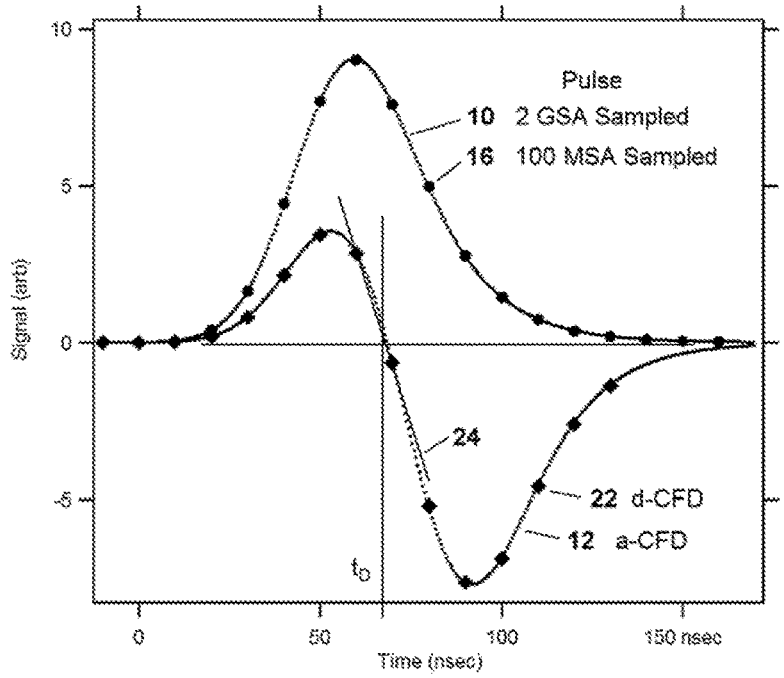
FIG. 2 (Prior Art) repeats the traces of FIG. 1B as they would appear if digitally sampled at 2 GSA and 100 MSA.
Figure 5:
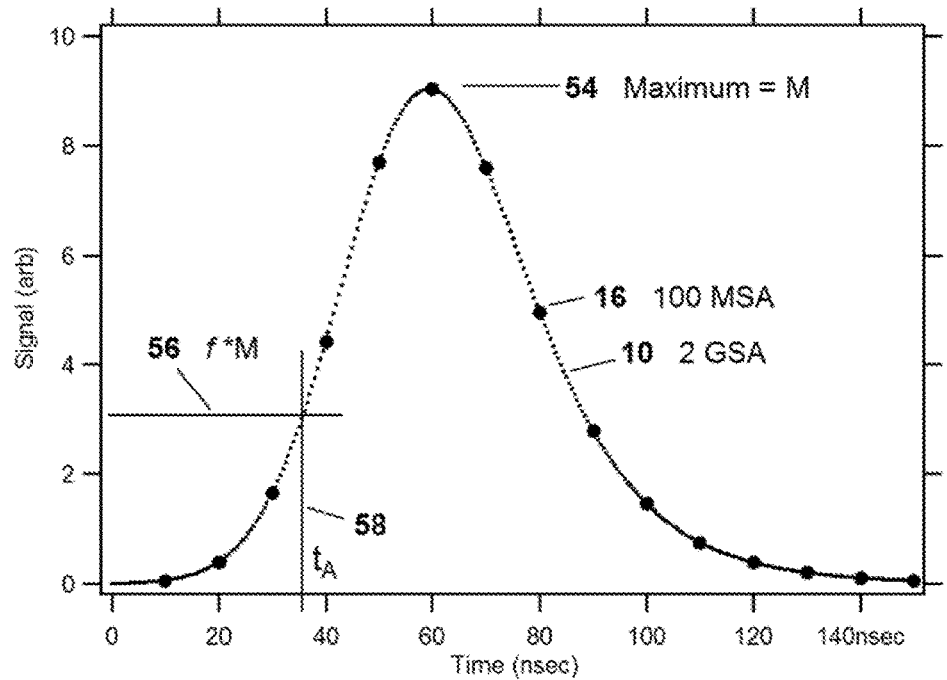
FIG. 5 repeats the trace of FIG. 1, digitally sampled at 100 MSA and 2 GSA, showing its maximum value M and constant fraction value f·M for making a direct determination of the constant fraction arrival time.
Figure 6:
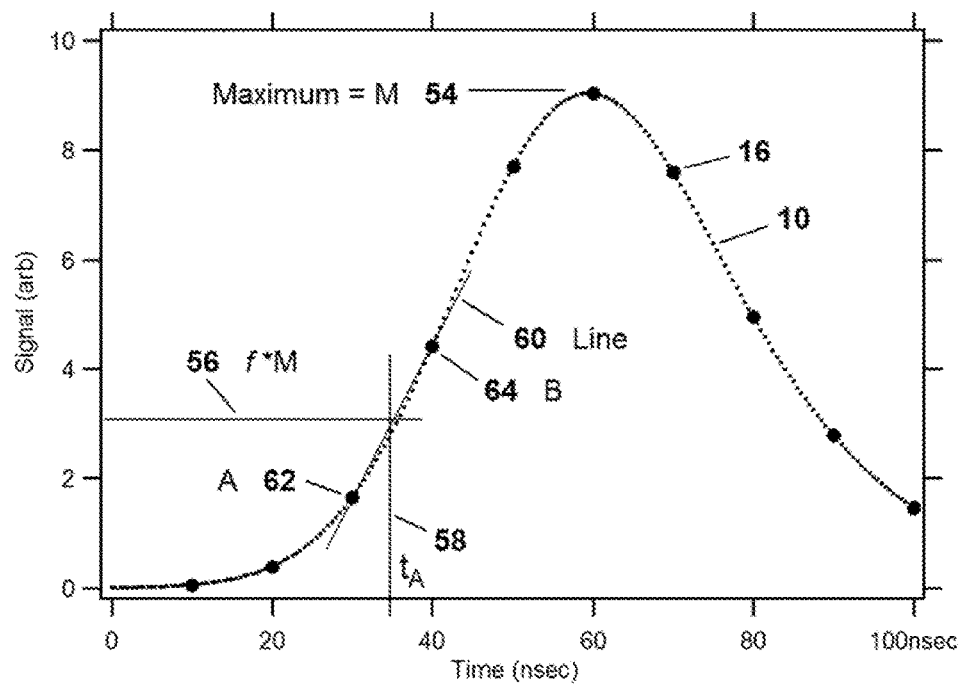
FIG. 6 repeats FIG. 5 showing the use of linear interpolation for finding the constant fraction arrival time from the 100 MSA digitized trace.
Figure 7:
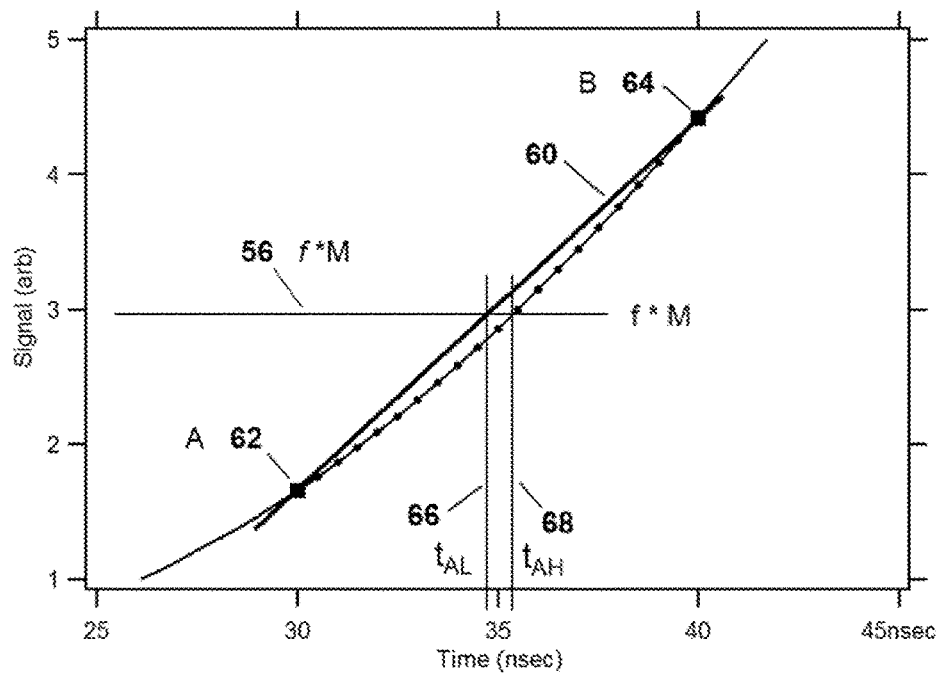
FIG. 7 shows an expanded view of FIG. 6 in the region where the trace crosses f·M.

FIG. 5 repeats the pulse of FIG. 1 as sampled at both 100 MSA 16 and 2 GSA 18. Conceptually, to carry out constant fraction discrimination, we wish to determine the pulse maximum M 54, create the fractional amplitude f·M 56, and then determine the arrival time $t_A$ 58 where the trace crosses this level. When the pulse is sampled at a rate that is high compared to the width of its features, i.e., at 2 GSA for the trace shown, then this procedure works well. The obtained value of M 54 is accurate, the trace is locally linear between digital samples in the vicinity of f·M 56, and the resultant value of $t_A$ 58 is close to the value that would be found by analog methods working on the continuous trace. However, and as expected from our discussion of FIG. 3, the method produces errors when making a linear extrapolation 60 between the slower 100 MSA data points A 62 and B 64 bounding f·M 56, as shown in FIG. 6. FIG. 7 expands the crossing region to make this point. Here, the time $t_{AL}$ 66 of crossing f·M as found from the 100 MSA linear interpolation 60 between A 62 and B 64 can differ significantly from the time $t_{AH}$ 68 of crossing found from the 2 GSA linear interpolation, the latter being essentially identical to the analog value $t_A$ 58 shown in FIG. 5.

Figure 8:
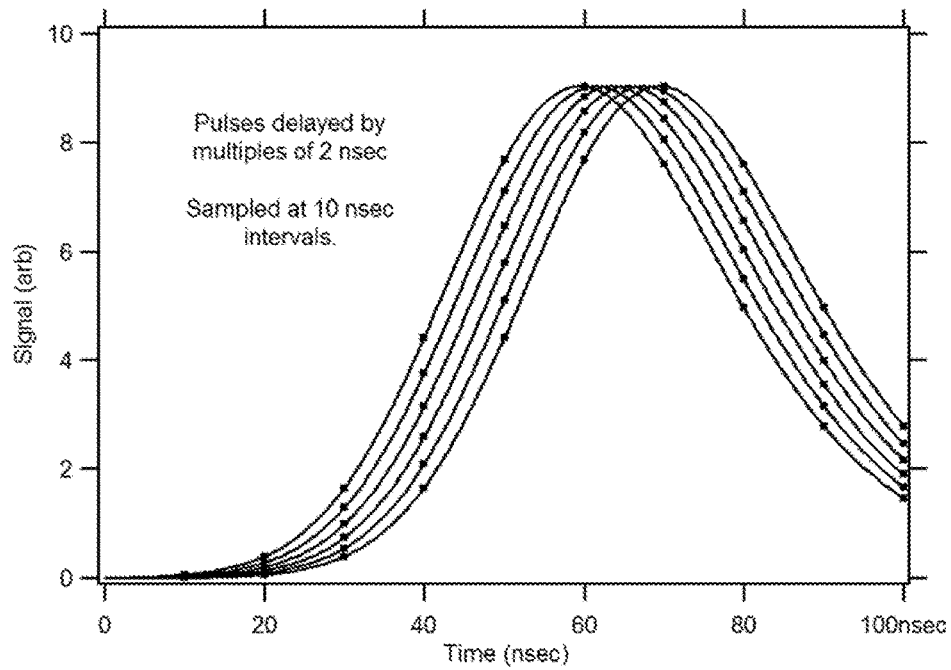
FIG. 8 shows the effect of delaying the trace of FIG. 1 by intervals of 2 ns when digitizing at 100 MSA.

Apparently unrecognized in the art is the role that errors in the value of M play in the accuracy of this procedure. To examine this issues, we first introduce the concept of arrival time offset ($\phi$), which is a measure of the offset between the signal pulse and the regular sampling intervals of the ADC. Conceptually, we imagine this as follows: first we consider the ADC's sampling comb (the regular intervals, say at 10 ns for a 100 MSA digitizer) laid out on a plot with time along the x-axis. Then we place the pulse to be sampled onto the plot and observe where the samples are captured as we slide the pulse to longer times, as shown in FIG. 8. Here all the samples are captured at 10 ns intervals, with the traces offset by 2 ns intervals. We can now define the pulse's arrival time $t_A$ as having two components:

$$t_A = t_L + \varphi, \quad (5)$$

where the local clock time $t_L$ is the time of the last digital sample before some well defined feature on the pulse and $\phi$ is the time difference between that feature and $t_L$. Obviously, while convenient, this definition of $t_L$ is completely arbitrary, since all the digital samples are separated from one another by known fixed intervals. In particular, the well defined feature will be the point on its leading edge where it crosses f·M. Another way of viewing this is that $t_L$ carries the sampling clock time while $\varphi$ carries the subsample time between the ADC samples. For example, at 100 MSA, $t_L$ will be in intervals of 10 ns, while $\varphi$ will be in fractions of a nanosecond or picoseconds ranging from 0 to 10 ns.

Figure 9:
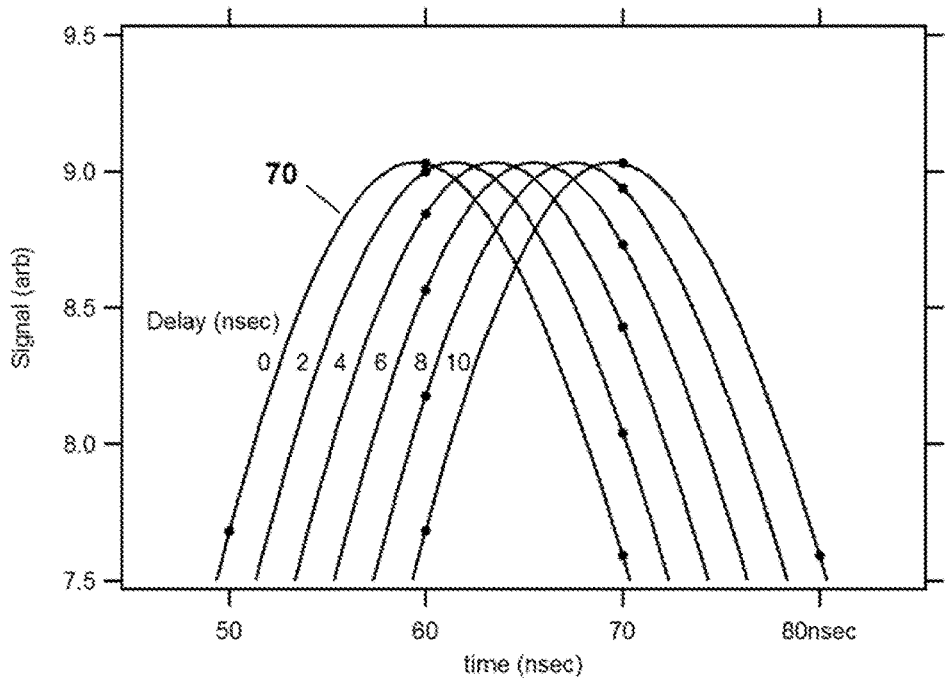
FIG. 9 shows an expanded view of the peaks of the traces in FIG. 8.

Looking at FIG. 8, it is immediately clear that the value of the maximum captured sample goes down and then up again as the value of the arrival time offset $\phi$, varies between 0 and 10 ns. Given the essentially random values of $\phi$, pulse to pulse, there is no guarantee that we capture a sample close to the true peak M of the trace. FIG. 9 enlarges the pulses' peak region to emphasize this point. The pulse 70, with a 0 ns delay, is sampled close to its peak. However, as $\phi$ is successively delayed by 2 ns intervals, the sample point moves away from the peak until approximately equals 5 and then the next sample starts approaching the peak. The trace with equals 10 ns is identically sampled to the trace with $\phi$ equals 0 ns, as expected for 10 ns ADC sampling intervals.

Figure 10:
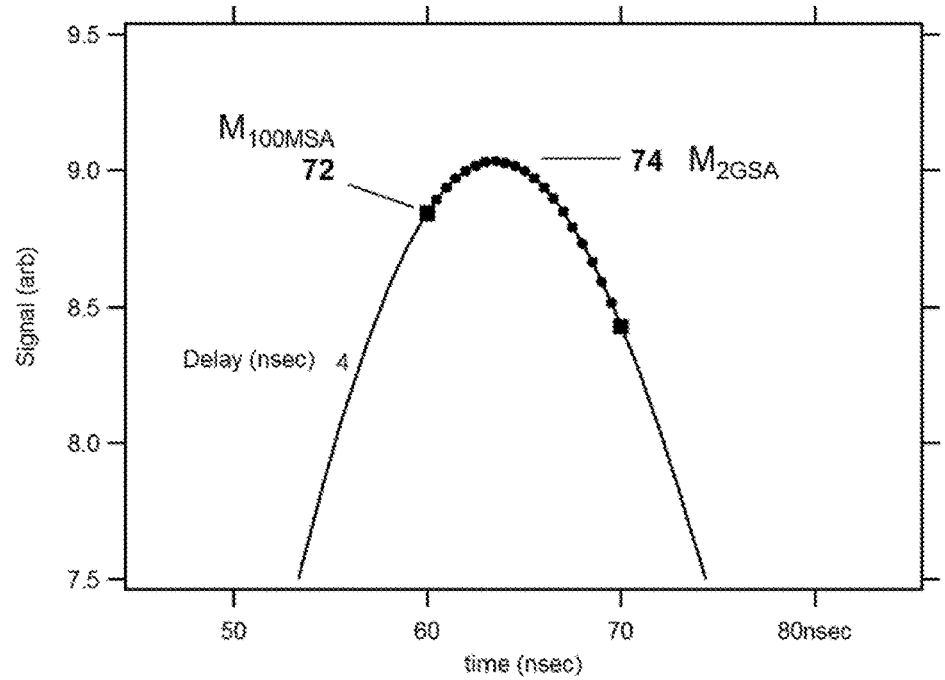
FIG. 10 shows the difference between 10 MSA and 2 GSA sampling in determining the trace's peak value when it is delayed by 4 ns.
Figure 11:
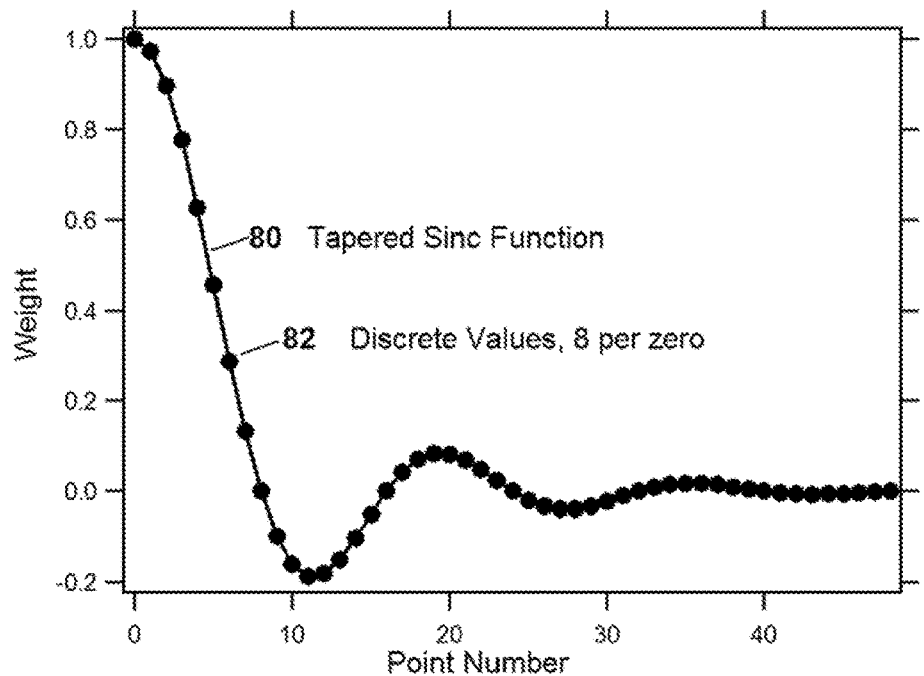
FIG. 11 shows the Gaussian tapered sinc function used for interpolating the 100 MSA data.

FIG. 10 demonstrates the difference in accuracy in determining M as the sampling rate is increased. For a pulse with $\phi$ equal to 4 ns, 100 MSA sampling finds a maximum $M_{100MSA}$ 72 at a value of about 8.8, while 2 GSA sampling locates $M_{2GSA}$ 74 at about 9.0, a 2.2% error. Noting that the slope of the trace is zero at its maximum, any errors due to the 2 GSA points not landing exactly on the maximum will be very small. This then, appears to be the reason why the commonly implemented digital CFD cannot be corrected by a single interpolation, it contains errors from two separate regions on the original curve, one at the pulse maximum and one in the vicinity of the f·M crossing.

2.3. An Accurate Digital Constant Fraction Discrimination Method

Our research has found that it is possible to implement an accurate constant fraction discrimination (CFD) method by treating these two sources of error independently, specifically by independently interpolating the pulse in its peak and f·M regions. Here we use the word "interpolate" in its general sense, meaning to provide estimates of the value of the original analog trace at time values between the captured digital values. The estimated values can be either continuous or discrete in time.

One approach, which does not make use of our inventive insight, would be to make some sort of analytic fit to the entire pulse, which will automatically provide continuous interpolations in the two regions, as represented by EQN. 2 and its associated discussion. We see two issues with this approach. First, if the selected function does not accurately match the pulse's true shape in both regions, then timing errors will result. Since fitting functions are generally selected for their ability to deliver a low value of $\chi_2$ over the entire curve, they may not necessarily produce high fidelity in the limited regions that we care about. Second, fitting pulses to a complex analytic function involves non-linear least squared procedures that cannot currently be implemented in real time using a digital spectrometer's limited resources, at least not for significant counting rates. This approach was implemented by [Haselman—1997, 2011] and by [Paulauskas—2014] but did not produce state of the art results.

2.3.1. General Approach

Our approach will be to interpolate the two regions separately. In the following we will assume that each pulse's baseline is either known or zero and, when we speak of pulse values, levels, etc., we mean them to be measured above the baseline, as is well known in the art. Our general approach will consist of three steps: First, interpolating the peak region of the digitized signal pulse to determine its maximum value M above baseline; second, multiplying M by the fraction f to obtain the constant fraction level f·M; and, third, interpolating the pulse's leading edge to determine the time at which the pulse crosses the constant fraction level f·M above baseline, this time $t_A$ being taken at the pulse's arrival time.

2.3.2. Implementation Using Fitting Methods

Many interpolation methods that employ fitting are known in the art, including polynomials and splines, either of which could be implemented in FPGAs and used in our inventive method. For example, we could determine M by locally fitting the digitized pulse using such an analytic function and then finding M by finding the maximum in the fitted function (i.e., by locating the point where its derivative is zero). Similarly, $t_A$ could be found by locally fitting such an analytic function to the digitized pulse's leading edge in the vicinity of the constant fraction level f·M and then solving algebraically to find the time where the analytical function crosses f·M, this being $t_A$.

Further, just because making analytic fits to the entire pulse has not provided good timing resolution in the past, this does not mean that, guided by our insights into the specific need for trace fidelity in the peak and f—M crossing level regions, a more precise analytic curve could not be found to accurately fit traces from specific types of detectors. In such a case, our method could be implemented by fitting the entire pulse with the said analytic function, finding the maximum in the fit function to determine M and then solving algebraically to find the time where the analytical function's leading edge crosses f·M.

2.3.3. Implementation Using Convolution Methods

The other common class of interpolation methods known in the art are convolution methods, whose origin lies in Fourier transform theory, where it is well known [Wolberg—2004] that one can perfectly reconstruct the continuous function g(x) from its sampled representation $g_s(x)$ via:

$$g(x)=\mathrm{sinc}(x)*g_s(x)=\int_{-\infty}^{\infty}\mathrm{sinc}(\lambda)g_s(x-\lambda)d\lambda, \quad (6)$$

where sinc(λ) is the ideal convolution kernel given by:

$$\mathrm{sinc}(x)=\sin(x)/x, \quad (7)$$

provided that the sampled function g(x) has been properly bandwidth limited to satisfy the Nyquist criterion. However, it is also well known that this form cannot be used in practice because of the infinite convolution interval. It is further known that truncating sinc(λ), e.g., multiplying it by the rect function that is unity for |x|<a and zero elsewhere), typically leads to oscillations in the interpolated function g(x). As a result, the art has developed a great variety of finite width interpolation kernels, either by truncating sinc more gently, using functions such as the Hann or Hamming, or using other functions entirely, such as the triangle filter or cubic approximation to the sinc function. [WOLBERG—2004].

Therefore, given adequate computational power, one can implement the inventive method using convolution with an appropriately selected kernel. The first step would be to find the value M of the pulse's maximum by the steps of calculating values of the signal pulse at time intervals between two or more digitized signal pulse values near the pulse maximum by convolving portions of the digitized signal pulse by a kernel and then using these calculated values to determine M. In this process we note that, while convolution can produce interpolated values at any point density in time, we only need to approximate the density of points produced by a very high-speed ADC, as shown in our discussion of FIG. 10. We therefore compute point values in a region that spans the pulse's peak and choose the maximum value as M.

Then, having multiplied M by f to obtain the constant fraction value f·M, we determine where the pulses leading edge crosses the constant fraction value f·M above baseline by interpolating values of the signal pulse at closely spaced time intervals between two or more digitized signal pulse values bracketing f·M, where these interpolated values are found by convolving portions of the digitized signal pulse by a kernel, and then using these interpolated values to determine where the pulse crosses f·M. That is, we use convolution to provide a more closely spaced set of interpolated trace values at least between the two trace samples bracketing f·M (see FIG. 7) and use them to locate the crossing point. As further shown in FIG. 7, the easiest method for locating the crossing point would be to find the pair of interpolated points that bracket f·M, join them with a straight line, and solve for the intersection of this line with the value f·M, which will be adequately accurate, provided that the interpolated values are closely enough spaced.

2.3.4. Preferred Convolution Method

As noted above, the virtue of using a terminated sinc function as the convolution kernel is that it makes the region of integration finite, or, in the discrete case, restricts the convolution summation to a finite number of terms. The cost of this restriction is that the interpolated function oscillates about the true function. In order to minimize these oscillations, which would degrade our time resolution, we therefore developed the following discrete convolution kernel, the discrete tapered sinc (tsinc) function defined at point i as:

$$t\mathrm{sinc}(i)=\mathrm{sinc}(i\pi/N)\exp(-(i/T)^2), \quad (7)$$

where N is the number of interpolated points per data point and T is a tapering constant. The underlying concept here is that the convolution of the sampled pulse by tsinc equals the (convolution of the sampled pulse by sinc) multiplied by the Gaussian, which then has no oscillations. While both of these functions are nominally infinite in extent, the Gaussian falls to zero so rapidly after a few multiples of T that larger values of i can be ignored without significant consequence. In a typical preferred implementation, N is 8, T is 30 and i is computed for values between ±48, which corresponds to L equals 6 lobes of the sinc function. That is, the number of points on each side of zero equals L×N although, because the function is even, we will only use positive i values in our operations. We note that this interpolation function preserves the values of the data points it interpolates between. As a concrete example, if N is 8 and our data are collected at 10 ns intervals (100 MSA sampling), then the interpolated points will be at 1.25 ns intervals (as if from 800 MSA sampling), while starting with data at 250 MSA produces interpolated data at the equivalent of 2 GSA sampling. FIG.

11 shows this preferred implementation of tsinc, which can be seen to have little amplitude beyond i equal to 48. Both the continuous function 80 and discrete values 82 are shown. Note that there are N−1=7 points between each of the function's zeros.

Figure 12:
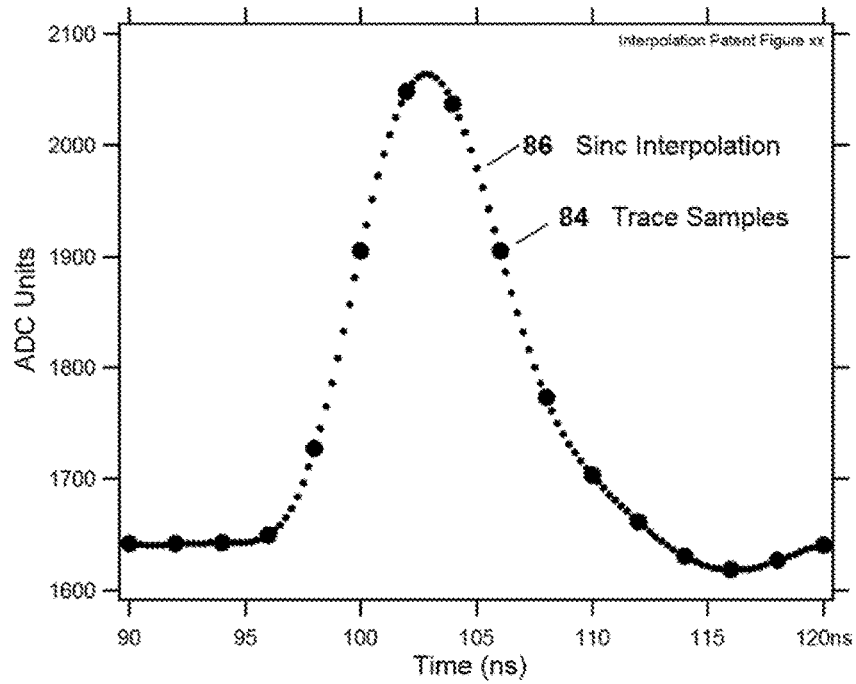
FIG. 12 shows a fast PMT trace interpolated using the tapered sinc function.

FIG. 12 shows an actual fast trace 84 that was digitized at 500 MSA from a PMT illuminated by an 80 ps laser pulse. The tapered sinc interpolation 86 is seen to be smooth between the data points, without any obvious oscillations near the peak, which was our goal. We notice that, because of the speed of this pulse, with a FWHM of only 7 ns, 500 MSA is not nearly fast enough to capture an accurate peak value M. The interpolation, however, nicely fills in the gap, as desired and we can proceed to carry out the inventive method using this specific convolution kernel.

2.3.5. Finding the Maximum M

The formula for finding an interpolated value g(j,k), where j indexes the sampled data points and k is the number of the interpolated point between j and j+1, where k ranges from 1 to N−1, is:

$$g(j,k) = \sum_{i=0}^{L-1} (y(j-i) t\text{sinc}(iN+k) + y(j+1+i) t\text{sinc}((i+1)N-k)). \quad (8)$$

Figure 13:
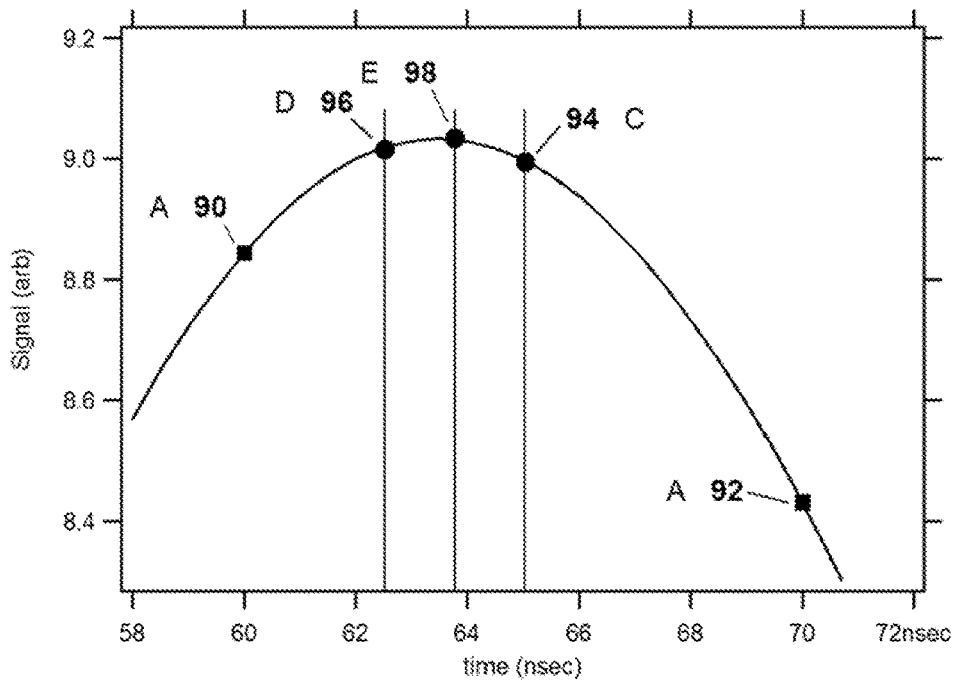
FIG. 13 shows an interpolation method for estimating the peak value of the 4 ns delayed 100 MSA digitized trace.

The tsinc values will be stored in a lookup table. With L=6, EQN. 8 shows that reconstructing each interpolated point g(j,k) requires 12 multiply and accumulate operations (MACs). Therefore making a full reconstruction of the trace, as per FIG. 12, requires 1,440 MACs, which is unnecessary, since we only require data between the two highest points, to obtain M, and between the two points bracketing f·M, to obtain $t_A$, as discussed earlier. Doing so reduces the number of MACs to 192, a definite improvement. However, by implementing a binary search routine, we can do even better. Consider FIG. 13, where we want to find the maximum between highest data points A 90 and B 92. Assuming that N=8, meaning that there are at most 7 possible interpolated points between A and B, we first compute g(A,4) at the midpoint between A 90 and B 92, resulting in point C 94. Noting that A is higher than B, so that the maximum must lie between A and C, we next compute g(A,2) midway between them, to obtain point D 96. Similarly continuing to compute the point midway between the two highest points, now C and D, we find g(A,3) for point E 98. The maximum computed point, in this case E, is the maximum M we seek. We note that this binary search process is very efficient. We only needed to make 3 interpolation computations, using 36 MACs. Further, doubling the density of interpolated points, to N=16, requires only a single additional search point, the number of search points being K, where $N=2^K$.

2.3.6. Finding φ and $t_A$

Finding $t_A$ involves first estimating the arrival time offset φ. This process has two major steps. In a conceptually simple implementation, we first interpolate N points between the two digitized trace points A 62 and B 64 bracketing f·M (see FIG. 7) and, second, linearly interpolate between the two interpolated points bracketing f·M in order to obtain our best estimate of the arrival time offset φ where the analog pulse would cross f·M. That is, we join these two points with a straight line and then solve for its intersection with f·M. We then find $t_A$ by adding φ to the clock time $t_L$ of point A 62, per EQN. 5.

Figure 14:
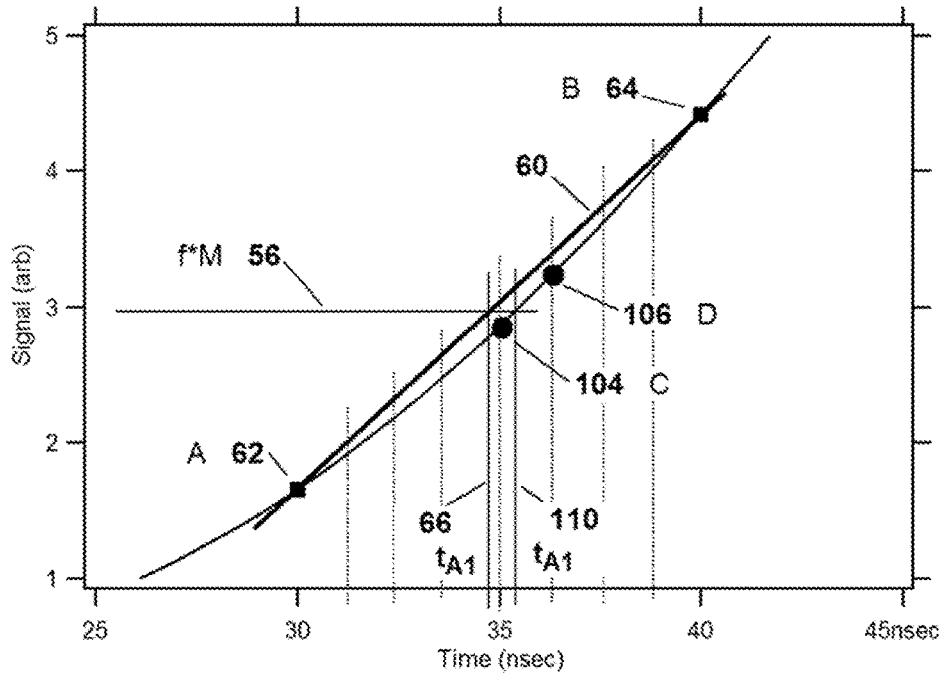
FIG. 14 shows an interpolation method for estimating the time when the 4 ns delayed 100 MSA digitized trace crosses the level f·M.

The process is illustrated in FIG. 14. As with finding M, we employ a search method to minimize computations by only computing a subset of the N points between the bracketing data points A 100 and B 102. Rather, we first estimate the time $t_{A1}$ from the intersection, point C 104 between f·M 56 and the straight line 60 between A and B.

Next, we choose the interpolation time k closest to this value. These interpolation times, of which there are N−1 between points A and B (here 7), are shown as the dotted vertical lines in FIG. 14. In this example k=3 is closest, so we compute g(A,3)=point C 104. Comparison shows that g(A,3) is less than f·M, so we next compute the larger value g(A,4)=point D 106. Comparison shown that g(A,4) is larger than f·M, so, having found the pair of interpolated points g(A,3) and g(A,4) that bracket f·M we may now linearly interpolate between them to find $t_{AS}$ 110, our best estimate of φ. We then add $t_L$ of point A 62 to obtain $t_A$.

We note that finding φ only required two tsinc interpolations using 24 MACs. This, in our experience is common, though sometimes a third interpolation to point E 108 is required to bracket f·M. In cases where this search converges more slowly, a binary search replicating the process for finding M could be implemented to assure that no more than three interpolation computations are required. We also note that there is nothing magic about the value N=8. We have found it to produce good results, but if faster computation is required, a smaller number like N=4 could be used and, if higher precision results in better time resolutions, the number could be increased to 16. In the present implementation we are using values of N that are powers of 2 simply for ease in implementing the binary search. There is clearly no such limitation in the search for φ, nor, for that matter is there any a priori reason to use a binary search for M. N may therefore, in practice, have any value that is easy to implement and gives performance acceptable to the application.

We also observe that other interpolation kernels than tsinc could be used for either or both of the interpolations. The inventive concept is to perform separate interpolations to find M and φ, and is not based on any specific interpolation technique. In particular, the choice of interpolation technique will always be an engineering trade-off between accuracy in reproducing the local regions of the pulse shape and ease of computation with the limited time and computational resources that are available.

2.4. Results 1: Laser-Illuminated PMTs—Fast Pulses

In this demonstration, we simultaneously illuminated a pair of side-by-side ADIT L25D19 PMTs in a dark box using a 90 ps pulse of 405 nm laser light from an Edinburgh Instruments EPL-405 diode laser. The EPL-405's output was conducted by fiber optic into the dark box, illuminating a white scattering screen viewed by both of the PMTs. 50% neutral density filters could be inserted to attenuate the beam as desired. The PMTs' outputs were passed through a specialized unity gain Nyquist filter system that allowed the pulses to be filtered with 7 element Bessel filters with 3 dB points of 31, 45, 54, 63, 88, or 125 MHz. The pulses were then sampled using an XIA Pixie-500e, which has a 500 MSA, 14 bit ADC. Pulses were detected in coincidence and captured to disk in pairs, after which they were analyzed off-line using a custom data analysis program written in IGOR. In the IGOR program we applied the steps outlined above to extract a value of $t_A$ for each pulse in a pair independently and then histogrammed the differences between them to achievable time resolutions.

Figure 15:
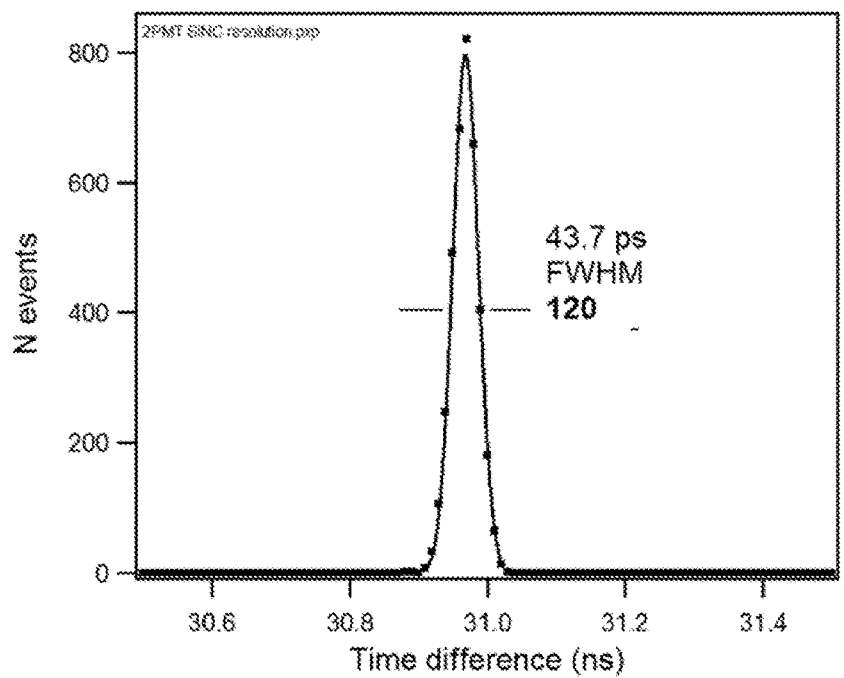
FIG. 15 shows the time resolution obtained by the inventive method applied to signals from a pair of laser excited PMTs when digitized at 500 MSA.

Investigation showed that achievable time resolutions depended upon a variety of factors, particularly including the voltages applied to the PMTs, the cutoff frequency of the Nyquist filter used, and the value of the fraction f. Best results were obtained for PMT voltages several hundred volts below the tubes' allowed maximum (i.e., 1000 V rather than 1,400V) and using a Nyquist filter that was down about 40 dB at the ADC's Nyquist frequency of 250 MHz. For the filters we used, this was the 63 MHz −3 dB filter. For these pulses, a value of f=0.35 gave the best results. We understand this as being a tradeoff between low values of f, which minimize transit time spread in the PMT, and higher f values which minimize the slope error in finding the crossing point. FIG. 15 shows these results, where we achieved a coincidence timing resolution of 43.7 ps FWHM, which is less than 2% of the 2 ns sampling interval at 500 MS/s. Since this result measures the resolutions of the two tubes in quadrature, this implies that the time resolution for a single tube is only 30.9 ps FWHM. Both of these results are considerably better than any we have found in the literature for similar fast pulse time resolution experiments using real detectors and are likely limited by the physics of the detectors rather than by our method.

2.5. Results 2: $^{60}$Co Irradiated LaBr$_3$ Crystals—Semi-Fast Pulses

In this demonstration, the same PMTs used above were each coupled to a 1" diameter, 1" long LaBr$_3$ crystal, and then laid in parallel, side by side, with a separation of about 1 cm and a weak $^{60}$Co source placed between them. Coincidence traces were captured using an XIA Pixie-16 with a 250 MSA, 14 bit ADC and analyzed off-line using the same program as above. Pulses from a single PMT, still for coincidence events, were histogrammed to produce energy spectra. Pulses from pairs were analyzed for their arrival times and the differences histogrammed to produce coincidence time resolution spectra.

Figure 16:
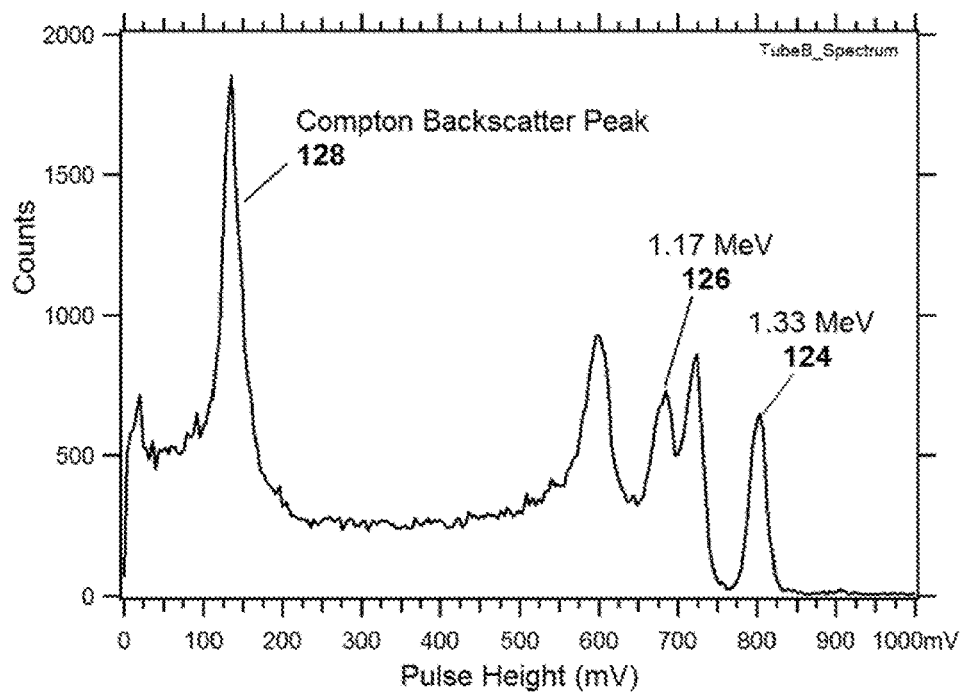
FIG. 16 shows a spectrum of pulse heights obtained by placing a $^{60}$Co source between two $LaBr_3$ scintillators, each coupled to a fast PMT.

FIG. 16 shows the resulting pulse height spectrum collected by one of the PMTs. The two marked peaks indicate full energy absorption events of the $^{60}$Co's 1.33 MeV gamma-ray at 800 mV 124 and its 1.17 eV gamma-ray at 675 mV 126. These two gamma-rays are emitted in coincidence. By far the more common coincidence event arises from a single gamma-ray that backscatters from one LaBr$_3$ crystal, creating the low energy peak 128 at 150 mV, and is then captured or scattered again in the other LaBr$_3$ crystal. When captured, the full gamma-ray energy is conserved, producing the nice secondary peaks at 600 mV and 725 mV from the 1.17 and 1.33 MeV gamma-rays, respectively. Scattering in the second LaBr$_3$ crystal produces the continuum lying between 200 and 550 mV. Taken together, this produces a very wide range of coincidence pulse amplitudes with which to test our inventive timing method.

Leaving the PMT voltages fixed at 1,200 V, we again varied Nyquist filtering and f value to obtain best results. These were found to occur with a 33 MHz Nyquist −3 dB filter frequency and an f value of 0.20. This Nyquist frequency is exactly half the value that gave the best results for 500 MSA sampling and thus reflects the same optimum condition: being down 40 dB at the nominal Nyquist frequency equal to half the sampling frequency. The lower value off found here is understood to reflect the added constraint of reducing timing jitter arising from the photoelectron generating process in the LaBr$_3$ scintillators. Finally, the coincidence timing spectra were collected as a function of pulse height by setting threshold cuts at various percentages of the maximum signals from the PMTs. This is important, since it quantifies our method's sensitivity to pulse heights, it being well known that all timing methods work best with large pulses, where the signal to noise ratio is largest. In particular, we note that the largest pulses we worked with, corresponding to a 90% threshold, are still only 50% of the ADCs' input range, so possibly even better results could be obtained for larger pulses.

Figure 17:
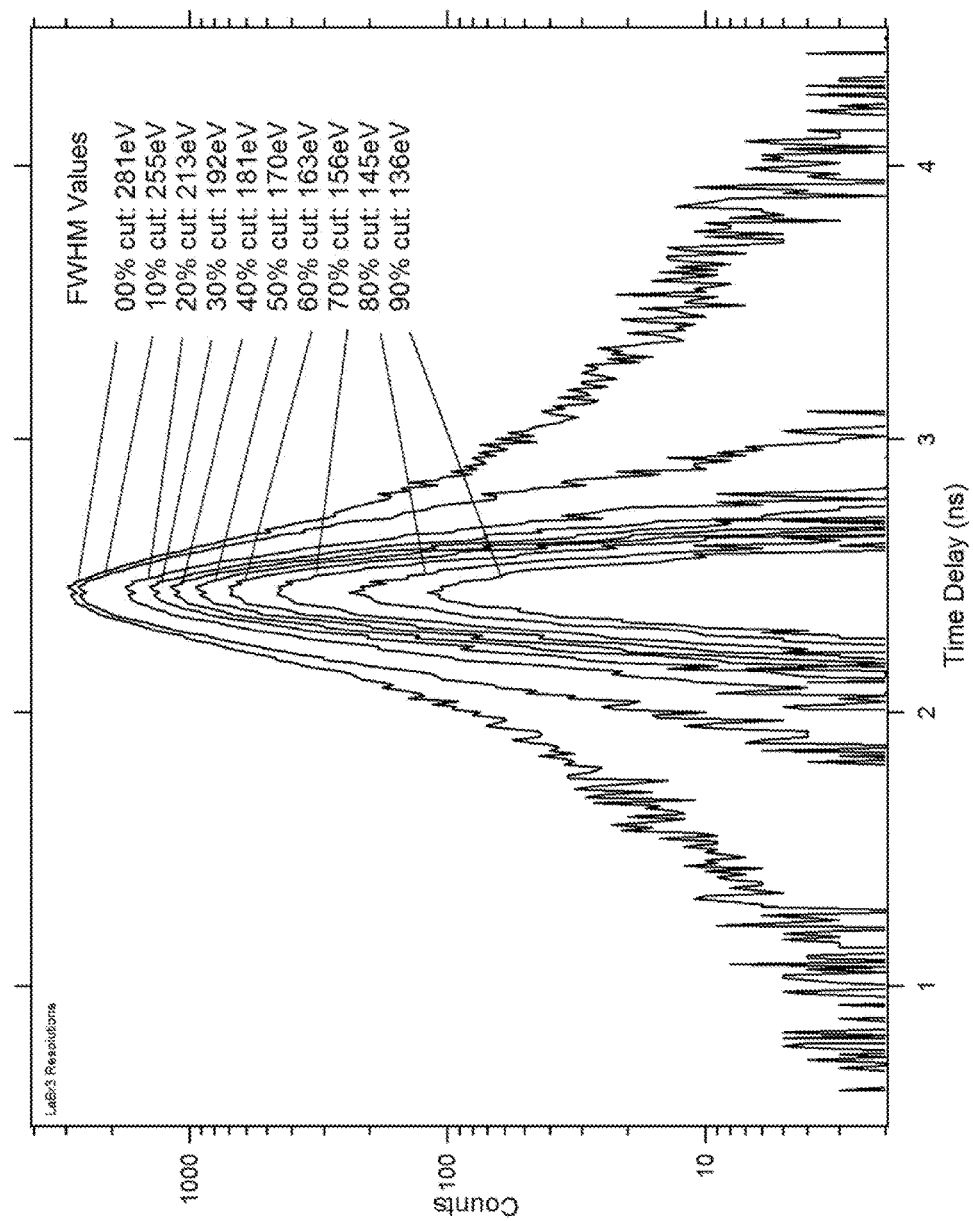
FIG. 17 shows coincidence time resolutions as a function of pulse amplitude for a $^{60}$Co source placed between two $LaBr_3$ scintillators, each coupled to a fast PMT.

FIG. 17 shows our results. The several spectra have been fit using a Gaussian fitting function to obtain their timing resolutions FWHM. We note that all of the spectra are essentially Gaussian excepting the one with no threshold cut at all, which is accepting pulses down to the Pixie-16's detection limit, which, from FIG. 16 is about 20 mV, or 1% of the ADC's input range. Even here the upper 90% of the curve is Gaussian, which includes the majority of pulses.

Achievable time resolution, as expected, improves with pulse height, ranging from 213 ps for a 20% cut (about 140 mV minimum pulses) to 136 ps for the 90% cut which excludes all but the 1.17-1.33 MeV gamma-ray coincidences. These values are between two and three times better than previously reported for digital spectrometers working with LaBr$_3$ scintillators and as good as, or perhaps slightly better than the best results reported with analog timing. Their values, in the range of 4-5% of the 4 ns sampling interval at 250 MS/s, are detector physics limited.

2.6. Implementation

Figure 18:
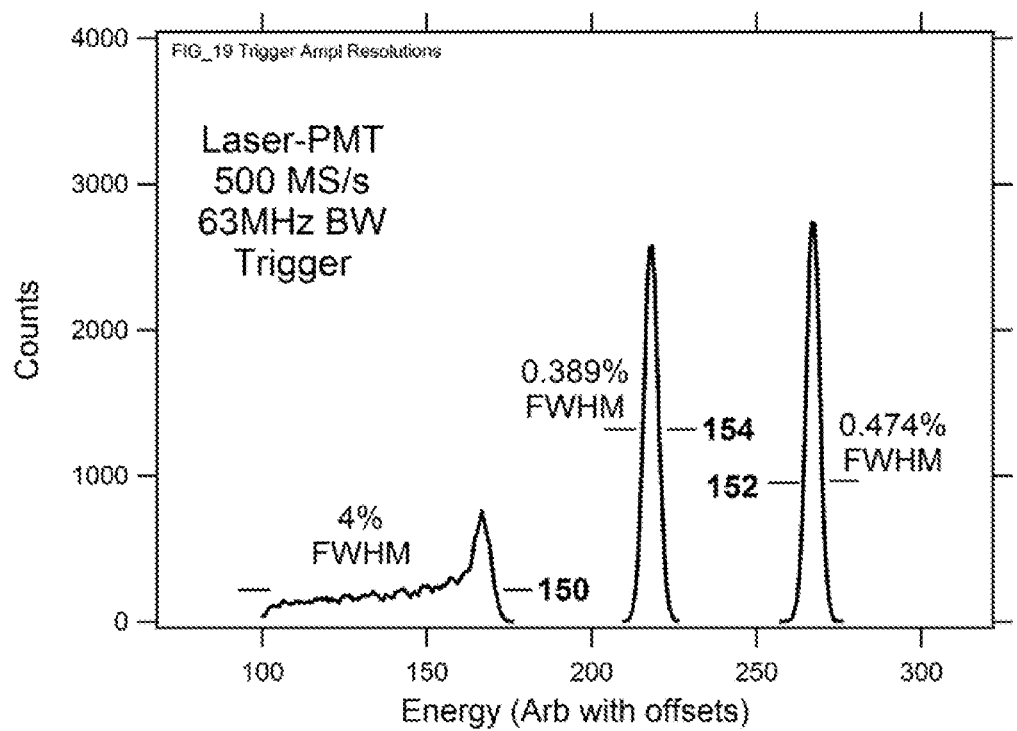
FIG. 18 shows a flow chart of the inventive algorithm as it would be implemented in a field programmable gate array.

FIG. 18 outlines the steps in the inventive algorithm when it is implemented in-line in a digital spectrometer 40 (see FIG. 4), using either the FPGA 46, DSP 48, or some combination of the two in order to allow input pulses from the sensor 42 to be processed in real time as rapidly as they are received.

In the first step 130, a pulse is detected in the digital data stream. Methods for doing this are well known in the art and typically include a threshold crossing by either the signal itself or by a filtered version of the signal. See, for example, the discussion of the fast trigger filter in [WARBURTON—1997; WARBURTON—1999]. Once detected, a pulse is then captured to some sort of local digital memory 132. This is also well known to the art—typically the input data are streamed into a FIFO memory and the streaming stopped a fixed time after the pulse is detected, the fixed time setting the captured trace length. In the third step 134, the captured pulse is parsed to locate the two highest points in its peak. In the fourth step 136, an interpolation is made between these two highest points to produce an estimate of the pulse's true maximum value M.

As discussed above, in a preferred implementation, the interpolation is carried out using a binary search method, calculating the individually interpolated points using the tsinc function defined in EQN. 7 in the convolution shown in EQN. 8. In the fifth step 138, the constant fraction f·M is found by multiplying M by the stored value/In the sixth step 140, the two trace points A 62 and B 64 bracketing f·M are found by parsing the captured trace a second time, typically starting at the highest point previously found and working backwards. In the seventh step 142, these trace points are used to compute a pair of interpolated points also bracketing f·M, where, in a preferred embodiment, they are located using the local search procedure described above, starting from the interpolation time that is closest the time where the linear extrapolation between the bracketing data point intersects the value f·M and then moving to larger or smaller interpolation times as the interpolated value is found to be less than or greater than f·M.

In the eighth step 144 the arrival time offset $\phi$ is found from the intersection between f·M and a straight line between the two interpolated points that bracket f·M, being in interpolated time units. In the ninth step 146 the pulse's full arrival time $t_A$ is found by adding $\phi$ to the time of arrival of point A 62, whose time is known in ADC clock cycles. $t_A$ is then recorded, together with any additional information about the pulse that may be extracted by other analysis processes. In particular, the value M may be stored as an estimate of the energy of the event producing the pulse, as we now discuss in further detail.

2.7. An Accurate Digital Amplitude Measurement Method

Following the development of an accurate time of arrival algorithm, as described above, we asked the further question—how would the developed method of determining the pulse amplitude M compare to existing art methods? As shown above, having an accurate estimate of M is critical to producing an accurate time of arrival. Our improved timing results therefore suggest that our M determination method might also offer benefits on its own. We therefore modified the analyses used in Results 1 and Results 2, above, to extract the determined M values directly for histogramming. In both cases, three estimated values of the pulse maximum were extracted: 1) the amplitude, which is the largest digitized value; 2) the value M determined by interpolation using the tsinc function; and, 3) the pulse integral, as an estimate of its maximum value. Methods 1 and 3 are common prior art methods.

2.8. Results 3: Laser-Illuminated PMTs—Fast Trigger Pulses

In Results 1, as described above, we measured the time between two pulses from a pair of PMTs illuminated by 90 ps pulses from an Edinburgh Instruments EPL-405 diode laser. For each pulse, the laser also produced a trigger pulse, 0.5 V high, lasting about 4 ns, with sub-nanosecond rise and fall times. Being electronically produced, these pulses are quite uniform in amplitude and, being very fast, challenge any digital analysis method. The pulses were Nyquist filtered with a 7-element Bessel filter with a 63 MHz 3 dB points and digitized using an XIA Pixie-500e, which has a 500 MSA, 14-bit ADC, as above. Each digitized pulse contained about 10 points above baseline, which were summed to estimate the pulse area and normalized for comparison the peak values. The recorded maximum was the largest value on the digitized pulse, while M was found by tsinc interpolation, as described earlier.

Figure 19:
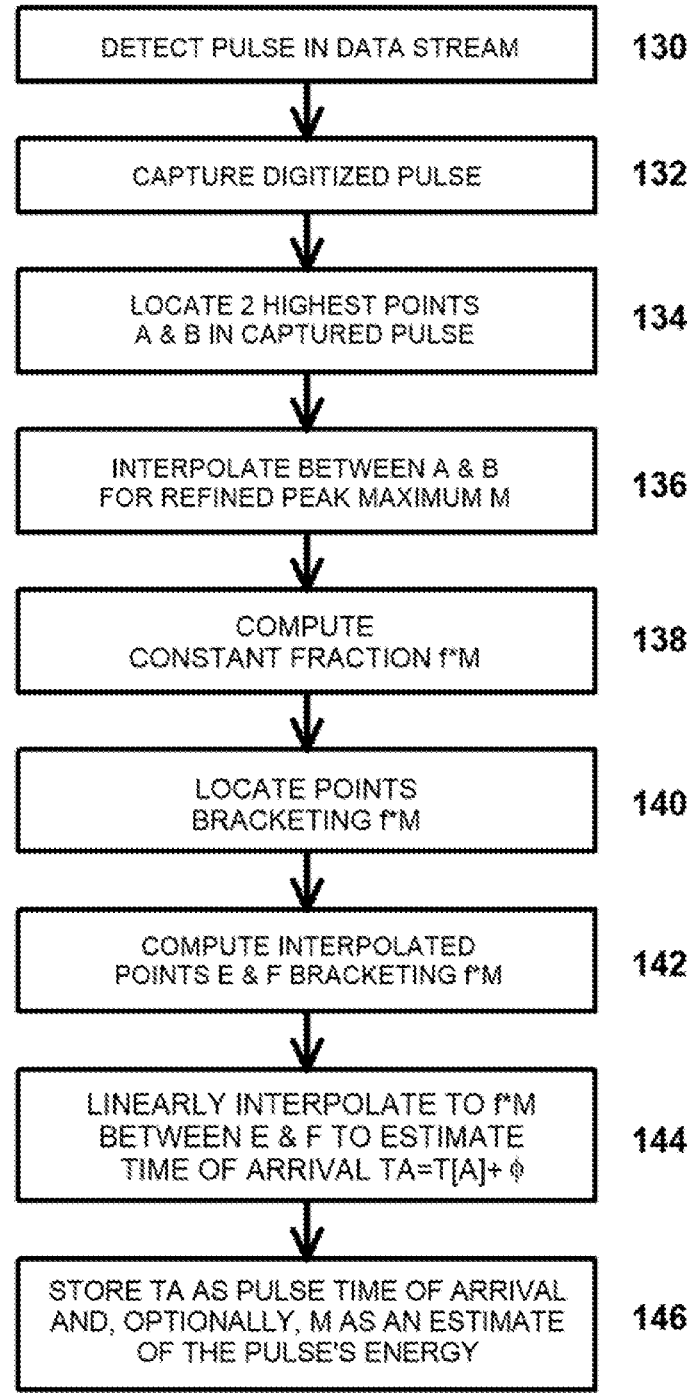
FIG. 19 shows amplitude resolutions comparing the inventive method to other approaches for very fast pulses from a laser-illuminated PMT.

FIG. 19 shows the histogrammed results. The maximum values 150 show a distorted non-Gaussian peak, with an approximate FWHM of 4%. The area values 152 show a good Gaussian peak with a FWHM value of 0.474%, reflecting the narrow range of amplitudes produced by the electronic pulser. The M values 154 also produce a Gaussian peak with an even better resolution of 0.389%. The area method is thus 22% worse, while the simple peak method is about 10 times worse.

2.9. Results 4: $^{60}$Co Irradiated LaBr$_3$ Crystals—Semi-Fast Pulses

Figure 20:
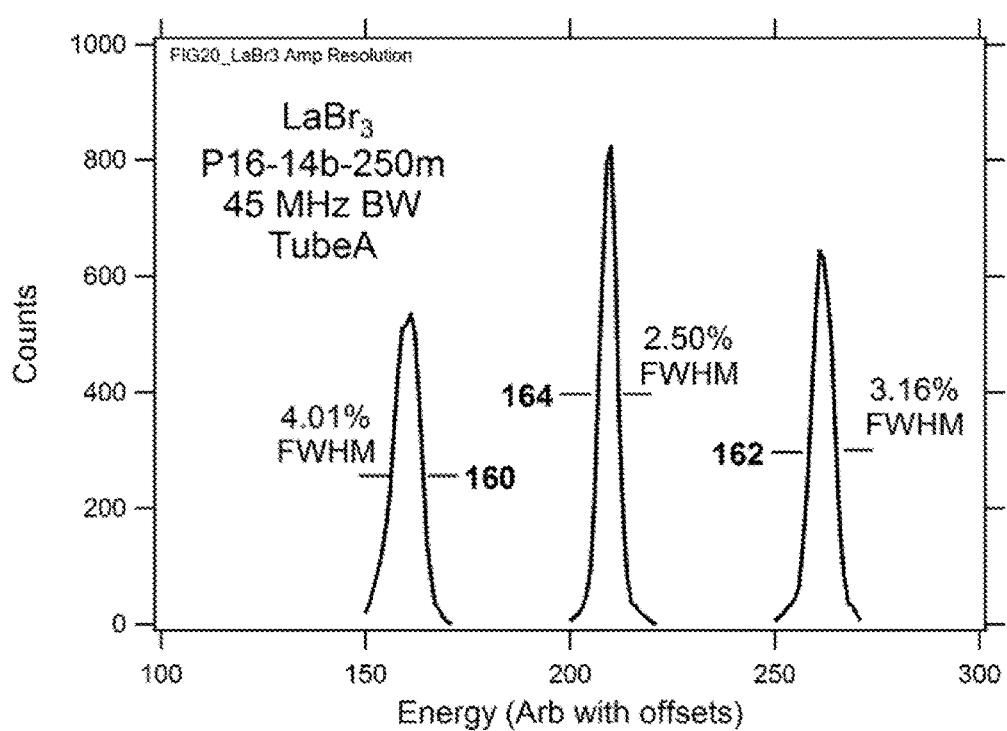
FIG. 20 shows amplitude resolutions comparing the inventive method to other approaches for pulses obtained from a fast organic scintillator.

This analysis used exactly the same pulses as in Results 2 above, wherein we extracted the pulse maxima, areas, and M values from the 1.33 MeV photons. FIG. 20 shows the results. All three histograms are nominally Gaussian, with the maxima 160 having a FWHM of 4.01%, the areas 162 having a FWHM of 3.16%, and the M values 164 having a FWHM of 2.50%. The M value matches the best literature values obtained for 1.33 MeV photons from LaBr$_3$. The area and maximum values are, respectively, 26% and 60% worse.

2.10. Discussion

These results show that the inventive method is capable of producing improved energy resolutions, compared to existing digital methods, and, in particular, to the "energy" or pulse integration method, that is currently the gold standard. Which to implement is clearly an engineering decision in any given applications. The integration is quite simple to implement, requiring only a summation of values exceeding a preset threshold, where the interpolation method requires more extensive computations and thus consumes more resources for on-line execution. However, as the Cost of Digital Processing Continues to Fall, this Objection Will have Less Importance in the Future.

3. References

The entire disclosures of all the references mentioned above and listed below are hereby incorporated by reference for all purposes.

U.S. Patent Documents

| | | | |
|---|---|---|---|
| BURNS - 1995 | 5,382,848 | January 1995 | Burns and Tso |
| HASELMAN - 2011 | 8,003,948 | August 2011 | Haselman et al. |
| HAW - 1973 | 3,763,436 | October 1973 | Haw |
| KELLY - 1993 | 5,266,953 | November 1993 | Kelly et al. |
| VERNON - 2008 | 7,411,199 | August 2008 | Vernon |
| WARBURTON - 1997 | 5,684,850 | November 1997 | Warburton and Hubbard |
| WARBURTON - 1999 | 5,873,054 | February 1999 | Warburton and Zhou |

Other Publications

| | |
|---|---|
| BARDELLI - 2004 | Bardelli et al., "Time measurements by means of digital sampling techniques: a study case of 100 ps FWHM time resolution with a 100 MSample/s, 12 bit digitizer", NIM_A 521, 480-492 (2004). |
| BUZHAN - 2003 | Buzhan et al, "Silicon photomultiplier and its possible applications", NIM_A 504, 48-52 (2003). |
| DU - 2015 | Du et al., "Study of time resolution by digital methods with a DRS4 module", arXiv: 1506.07219 24Jun2015. |
| FALLU-LABRUYERE - 2007 | Fallu-Labruyere et al., "Time resolution studies using digital constant fraction discrimination", NIM_A, 579, 247-251 (2007). |
| HASELMAN - 1997 | Haselman et al., "Simulation of algorithms for pulse timing in FPGAs", *2007 IEEE Nucl. Sci. Symp. Conf. Record* 4: 3161-3165 (1997). |
| KNOLL - 2000 | Knoll, Chapter 17_IX_A "Time Pickoff Methods" in *Radiation Detection and Measurement* (Wiley, New York, 2000), pp. 659-665. |
| MOSZYNSKI - 2005 | Moszynski et al., "New Photonis XP20D0 photomultiplier for fast timing in nuclear medicine" NEEDS A REFERENCE |
| MUTTI - 2013 | Mutti et al., "FPGA implementation of a digital constant fraction discriminator for fast timing in the picosecond range", Poster TUPPC083, Proc. ICALEPCS2013 (San Francisco, CA 2013), available at accelconf.web.cern.ch/AccelConf/ICALEPCS2013/papers/tuppc083.pdf. |
| PAULAUSKAS - 2014 | Paulauskas et al., "A digital data acquisition framework for the Versatile Array of Neutron Detectors at Low Energy (VANDLE)", NIM_A, 737, 22-28 (2014). |

| RONZHIN - 2010 | Ronzhin et al., "Tests of timing properties of silicon photomultipliers", FERMILAB-PUB-10-052-PPD or SLAC-PUB-14599. |
| --- | --- |
| TIEGE - 2005 | Tiege et al., "Photomultiplier pulse timing using flash analog-to-digital converters", GlueX Note - zzz, Jan. 24, 2005, available at https://userweb.jlab.org/~brads/Manuals/Hardware/JLab/FADC/timing_extraction/Tiege-FADC_timing_algorithm-Jan2005.pdf. |
| WANG - 2016 | Wang et al., "Waveform timing performance of a 5 GS/s fast pulse sampling module with DRS4", available at arXiv.org at https://arxiv.org/pdf/1501.00651. |
| WOLBERG - 2004 | Wolberg, Chapter 39 "Sampling, Reconstruction and Antialiasing", in *Computer Science Handbook*, $2^{nd}$ Ed., A.B. Tucker, Ed. in Chief, (CRC Press, New York, 2004). |

4. Conclusions

In the foregoing description of specific embodiments we have shown examples of a general digital processing technique determining the time of arrival of digitized electronic pulses that equals or exceeds the time resolutions achieved by traditional analog methods using data from ADCs that are an order of magnitude or more slower than the current state of the art (i.e., 250-500 MSA, compared to 5 GSA or higher). The method is compact enough so that it can be implemented using the FPGA and/or DSP digital processing resources available in a typical modern digital spectrometer. The method employs a new implementation of the concept of constant fraction discrimination. Whereas the classical technique focuses on interpolating the portion of the digitized pulse where it crosses the constant fraction value, our innovation teaches first interpolating the region of the pulse's peak, in order to obtain a more accurate estimate of its maximum value M, and then proceeding to interpolate the region where the pulse crosses the constant fraction value f·M in order to obtain the time of arrival.

Further, recognizing that, in order to obtain the best timing accuracy, it is critical for the interpolation function to accurately reproduce the shape of the underlying analog pulse, we have developed a novel tsinc convolution kernel, the product of the sinc function with a Gaussian, that preserves most of the classic sinc function's ability to exactly reproduce a digitized function while only requiring a small number of convolution terms, thereby allowing the method to be readily implemented in a medium sized FPGA or DSP with limited computation resources.

In a preferred implementation, we showed how we could use a search methods to minimize the number of points that actually needed to be interpolated in order to find the peak M and the f·M crossing point, further reducing the method's computational burden.

We also showed that the inventive method for determining the pulse's maximum value has utility in its own right for capturing pulse amplitudes, particularly as they pertain to representing some quantity of interest, such as the energy deposited in a scintillator crystal.

As we made clear in the presentation, while these embodiments are functional and effective, they were primarily presented for purposes of illustration and description. Because the taught principle is a general one, the presentation was not intended to be exhaustive or to limit the invention to the precise forms described, and obviously, many modifications and variations are possible in light of the above teaching. Thus, these embodiments were chosen and described in order to best explain the principles of the invention and its practical application to thereby enable others in the art to best utilize the invention in various embodiments and with such modifications as best suit the invention to the particular uses contemplated.

Other forms, modifications, alternative constructions and equivalents can be used and those skilled in the art will appreciate that the method can clearly be applied to measurements in other areas than those described, wherein high-speed pulse arrival time information is desired. As a first example, while our preferred implementation uses the tsinc function and local searches to find the values of M and arrival time offset ϕ, the same method can be implemented using other local interpolation functions, such as low order polynomials or splines, or more complex functions intended to fit the entire pulse. As a second example, while the method is intended for on-line implementation using the relatively limited computational resources available in a digital spectrometer, the same method could be carried out off-line by a general purpose computer by first capturing detected traces to a storage device and then running an off-line processing program, exactly as we did to produce FIGS. 15, 17, 19, and 20. Third, while we demonstrated the method using pulses provided by photomultiplier tubes detecting light, many other sensors also produce pulses whose time of arrival is of importance. For example, in time-of-flight mass spectroscopy the pulses are generated by energetic ions striking microchannel plates, while in LIDAR, silicon detectors capture laser light reflected from an object and the arrival times of these pulses are used to measure the distance to the reflecting object.

Therefore, the above description should not be taken as limiting the scope of the invention, as defined by the appended claims.

What is claimed is:

1. A method for determining the arrival time of a digitized signal pulse whose baseline is known, comprising the steps of:
   (a) interpolating the peak region of the digitized signal pulse to determine its maximum value M above the known baseline;
   (b) multiplying M interpolated in step (a) by a constant fraction f to obtain the constant fraction level f·M; and then
   (c) interpolating the pulse's leading edge to determine the time ($t_A$) at which the leading edge crosses the constant fraction level f·M above the baseline,
   wherein the arrival time of the digitized signal pulse is determined as the time ($t_A$) interpolated in step (c).

2. The method of claim 1 wherein interpolating the peak region to determine the pulse's maximum M comprises:
   locally fitting the digitized pulse using an analytical function; and then
   finding M as the maximum in the fitting function.

3. The method of claim 2 wherein the analytic function is a polynomial or spline.

4. The method of claim 1 wherein the time at which the pulse crosses the constant fraction value f·M is found by:
   locally fitting the digitized pulse's leading edge using an analytical function, such as a polynomial or spline, and then
   solving algebraically to find the time where the analytical function crosses f·M.

5. The method of claim 1 wherein the interpolation in step (a) and the interpolation in step (c) are carried out by fitting the entire pulse with an analytical function, finding the maximum in the fit function to determine M, and then solving algebraically to find the time where the analytical function's leading edge crosses f·M.

6. The method of claim 1 wherein the value of M, so determined, is also saved as a measure of the amplitude of the pulse.

7. A method for determining the arrival time of a digitized signal pulse whose baseline is known, comprising the steps of:
   (a) interpolating the peak region of the digitized signal pulse to determine its maximum value M above the known baseline;
   (b) multiplying M interpolated in step (a) by a constant fraction f to obtain the constant fraction level f·M; and then
   (c) interpolating the pulse's leading edge to determine the time ($t_A$) at which the leading edge crosses the constant fraction level f·M above the baseline,
   wherein the arrival time of the digitized signal pulse is determined as the time ($t_A$) interpolated in step (c); and
   wherein step (a) comprises calculating values of the signal pulse at time intervals between two or more digitized signal pulse values near the pulse maximum by convolving portions of the digitized signal pulse by a kernel, and then using these calculated values to determine M.

8. The method of claim 7 wherein M is the maximum of the calculated values.

9. The method of claim 7 where the kernel is the discrete tapered sinc function tsinc, defined at point i as:

$$t\mathrm{sinc}(i)=\mathrm{sinc}(i\pi/N)\exp(-(i/T)^2), \quad (7)$$

where N is the number of interpolated points per data point and T is a tapering constant.

10. The method of claim 9 wherein the maximum M is found by interpolating the pulse at the N values of i between the two highest values of the digitized signal pulse and selecting the highest interpolated value.

11. The method of claim 9 wherein the maximum M is found by using a binary search between the two highest values of the digitized signal pulse to find the highest interpolated value.

12. A method for determining the arrival time of a digitized signal pulse whose baseline is known, comprising the steps of:
   (a) interpolating the peak region of the digitized signal pulse to determine its maximum value M above the known baseline;
   (b) multiplying M interpolated in step (a) by a constant fraction f to obtain the constant fraction level f·M; and then
   (c) interpolating the pulse's leading edge to determine the time ($t_A$) at which the leading edge crosses the constant fraction level f·M above the baseline,
   wherein the arrival time of the digitized signal pulse is determined as the time ($t_A$) interpolated in step (c); and
   wherein step (c) comprises interpolating values of the signal pulse at time intervals between two or more digitized signal pulse values surrounding f·M by convolving portions of the digitized signal pulse by a kernel, and then using these interpolated values to determine where the pulse crosses f·M.

13. The method of claim 12 wherein determining where the pulse crosses f·M is carried out by finding the pair of interpolated points that bracket f·M, joining them with a straight line, and solving for the intersection of this line with the value f·M.

14. The method of claim 12 where the kernel is the discrete tapered sinc function tsinc, defined at point i as:

$$t\mathrm{sinc}(i)=\mathrm{sinc}(i\pi/N)\exp(-(i/T)^2), \quad (7)$$

where N is the number of interpolated points per data point and T is a tapering constant.

15. The method of claim 14 wherein $t_A$ is found by interpolating the pulse at the N values of i between the two values of the digitized signal pulse that bracket the value f·M, finding the pair of interpolated points that bracket f·M, joining them with a straight line, and solving for its intersection with the value f·M.

16. The method of claim 14 wherein $t_A$ is found by interpolating the pulse for a subset of the N values of i between the two values of the digitized signal pulse that bracket the value f·M, the members of the subset being found by a search procedure that compares their values to the value of f·M and, having found the pair of interpolated points that bracket f·M, joining them with a straight line, and solving for the intersection of this line with the value f·M.

17. A method for determining the maximum value M of a digitized signal pulse whose baseline is known by calculating values of the signal pulse at time intervals between two or more digitized signal pulse values near the pulse maximum by convolving portions of the digitized signal pulse by a kernel and then using these calculated values to determine M.

18. The method of claim 17 where the kernel is the discrete tapered sinc function tsinc, defined at point i as:

$$t\mathrm{sinc}(i)=\mathrm{sinc}(i\pi/N)\exp(-(i/T)^2), \quad (7)$$

where N is the number of interpolated points per data point and T is a tapering constant.

19. The method of claim 18 wherein the maximum M is found by using a binary search between the two highest values of the digitized signal pulse to find the highest interpolated value.

20. An apparatus for digitally determining the time of arrival of pulses in an electronic signal, comprising an analog-to-digital converter (ADC), a digital computing device and a memory, wherein
   the ADC is configured to digitize the electronic signal; and
   the digital computing device is programmed to receive the digitized electronic signal from the ADC, detect pulses therein, and for each detected pulse:
   (a) interpolate the peak region of the detected pulse to determine its maximum value M above a known baseline;
   (b) multiply M interpolated in step (a) by a constant fraction f to obtain a constant fraction level f·M;
   (c) interpolate the pulse's leading edge to determine the time ($t_A$) at which the leading edge crosses the constant fraction level f·M above the baseline; and (d) determine the pulse's arrival time as the time ($t_A$) interpolated in step (c).

21. The apparatus of claim 20 wherein the computer is programmed such that either or both of the interpolations is carried out by locally fitting an analytic function to the digitized signal pulse.

22. The apparatus of claim 20 wherein the computer is programmed such that either or both of the interpolations is carried out by locally convolving the digitized signal pulse by a kernel.

23. The apparatus of claim 22 wherein the kernel is the tsinc function defined at a point i by $$t\mathrm{sinc}(i)=\mathrm{sinc}(i\pi/N)\exp(-(i/T)^2), \tag{8}$$

where N is the number of interpolated points per data point, T is a tapering constant and sinc(x) is the standard function $\mathrm{sinc}(x)=\sin(x)/x$.

24. The apparatus of claim 20 wherein the computer is programmed such that the value M, so determined, is saved in the memory as a measure of the amplitude of the pulse.

* * * * *